US012660437B2

(12) United States Patent
You

(10) Patent No.: US 12,660,437 B2
(45) Date of Patent: Jun. 16, 2026

(54) MOTHER SUBSTRATE FOR DISPLAY DEVICE AND MANUFACTURING METHOD OF DISPLAY DEVICE

(71) Applicant: Samsung Display Co., Ltd., Yongin-Si (KR)

(72) Inventor: Chun Gi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 628 days.

(21) Appl. No.: 17/887,772

(22) Filed: Aug. 15, 2022

(65) Prior Publication Data

US 2023/0232675 A1 Jul. 20, 2023

(30) Foreign Application Priority Data

Jan. 20, 2022 (KR) ........................ 10-2022-0008205

(51) Int. Cl.
| | |
|---|---|
| *H10K 59/131* | (2023.01) |
| *G09G 3/3233* | (2016.01) |
| *H10K 59/12* | (2023.01) |
| *H10K 71/00* | (2023.01) |

(52) U.S. Cl.
CPC ......... *H10K 59/131* (2023.02); *G09G 3/3233* (2013.01); *H10K 71/00* (2023.02); *G09G 2300/0426* (2013.01); *G09G 2300/0819* (2013.01); *G09G 2300/0842* (2013.01); *H10K 59/1201* (2023.02)

(58) Field of Classification Search
None
See application file for complete search history.

(56) References Cited

U.S. PATENT DOCUMENTS

| | | | | |
|---|---|---|---|---|
| 12,382,798 B2 * | 8/2025 | Kong | ..................... | H10K 71/00 |
| 2008/0297711 A1 * | 12/2008 | Kawasaki | ........... | G02F 1/13458 |
| | | | | 257/E27.111 |
| 2014/0285744 A1 * | 9/2014 | Son | ................... | G02F 1/136204 |
| | | | | 349/43 |
| 2015/0062473 A1 * | 3/2015 | Nishino | ............ | G02F 1/136204 |
| | | | | 349/40 |
| 2015/0214245 A1 * | 7/2015 | Kim | ..................... | H10D 86/441 |
| | | | | 438/618 |

(Continued)

FOREIGN PATENT DOCUMENTS

| | | | | |
|---|---|---|---|---|
| KR | 100714200 B1 | 5/2007 | | |
| WO | WO-2021169882 A1 * | 9/2021 | ......... | G02F 1/13338 |

*Primary Examiner* — Steven B Gauthier
*Assistant Examiner* — E. Rhett Cheek
(74) *Attorney, Agent, or Firm* — Innovation Counsel LLP

(57) ABSTRACT

A mother substrate for producing cell areas for a plurality of display device is disclosed that includes a base substrate and a ground area. The base substrate includes a plurality of cell areas and a ground area surrounding each cell area of the plurality of cell areas. A ground line is disposed to surround an edge of each cell area of the plurality of cell areas. A ground pad is disposed to be spaced apart from the ground line on the ground area. A ground connection electrode disposed on a surface of the ground line and a surface of the ground pad electrically connects the ground line with the ground pad. Each cell area of the plurality of cell areas includes a light emitting element and a thin film transistor disposed on the light emitting element.

8 Claims, 29 Drawing Sheets

(56)          References Cited

U.S. PATENT DOCUMENTS

| 2016/0073498 | A1* | 3/2016 | Yeo ........................ | H05K 1/111 |
| | | | | 361/748 |
| 2016/0197132 | A1* | 7/2016 | Cho .................... | H01L 23/5225 |
| | | | | 257/40 |
| 2019/0304921 | A1* | 10/2019 | Kuroe ................... | G02F 1/1333 |
| 2020/0064703 | A1* | 2/2020 | Ishikawa ............. | H10D 86/441 |
| 2022/0276735 | A1* | 9/2022 | Pu ........................ | G06F 3/0445 |

* cited by examiner

LEL: ANO, EML, CAT
ACTL: ACT1, ACT5
CDL1: GE1, GE5
CDL2: CAP1, CAP5
CDL3: SE5, DE5
CDL4: CNE5
CDL5: ANO

DR3

DR1 → DR2

CDL3: 140
CDL4: 150

FIG. 7

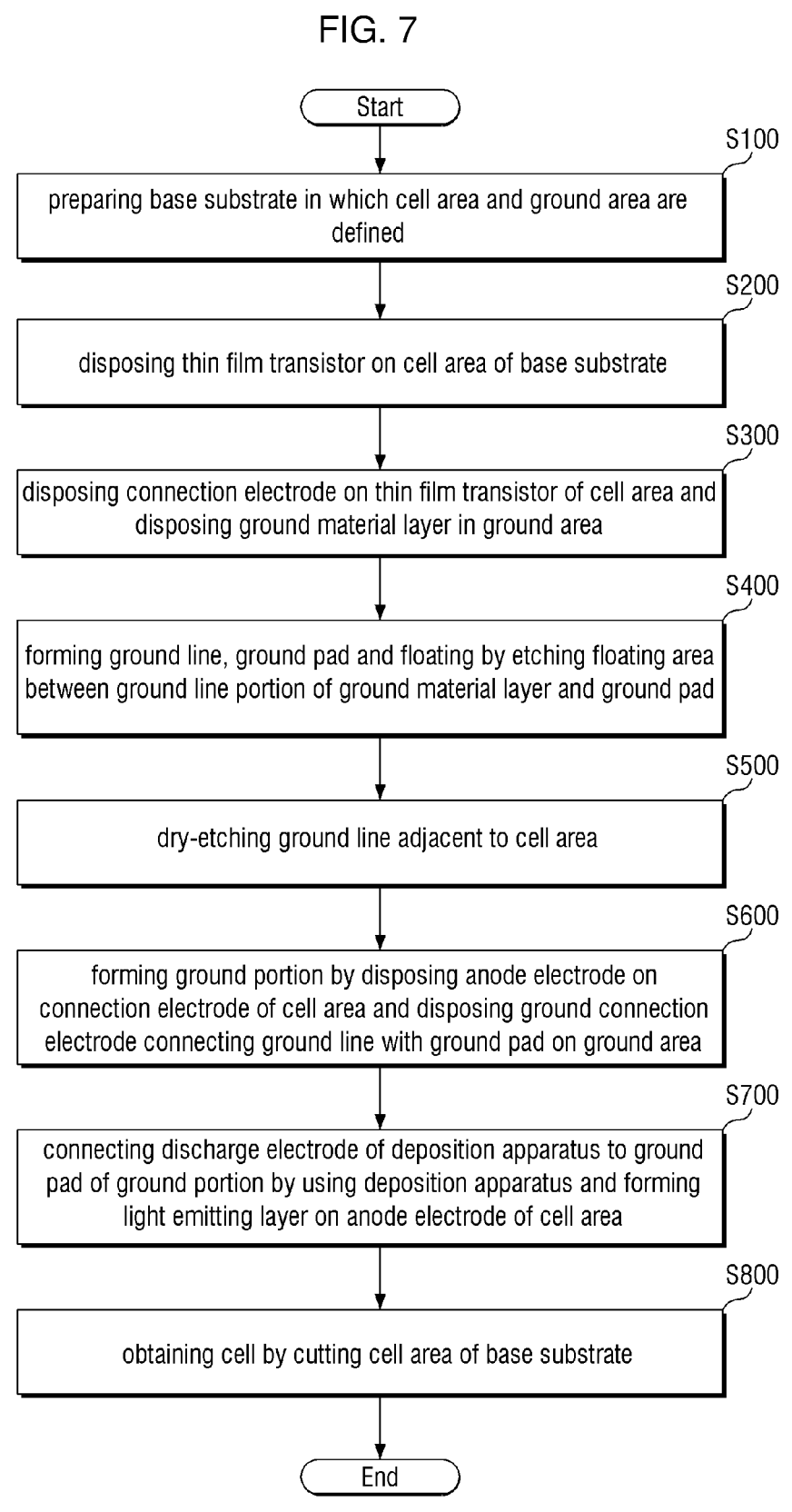

Start

S100 preparing base substrate in which cell area and ground area are defined

S200 disposing thin film transistor on cell area of base substrate

S300 disposing connection electrode on thin film transistor of cell area and disposing ground material layer in ground area

S400 forming ground line, ground pad and floating by etching floating area between ground line portion of ground material layer and ground pad

S500 dry-etching ground line adjacent to cell area

S600 forming ground portion by disposing anode electrode on connection electrode of cell area and disposing ground connection electrode connecting ground line with ground pad on ground area

S700 connecting discharge electrode of deposition apparatus to ground pad of ground portion by using deposition apparatus and forming light emitting layer on anode electrode of cell area

S800 obtaining cell by cutting cell area of base substrate

End

FIG. 8
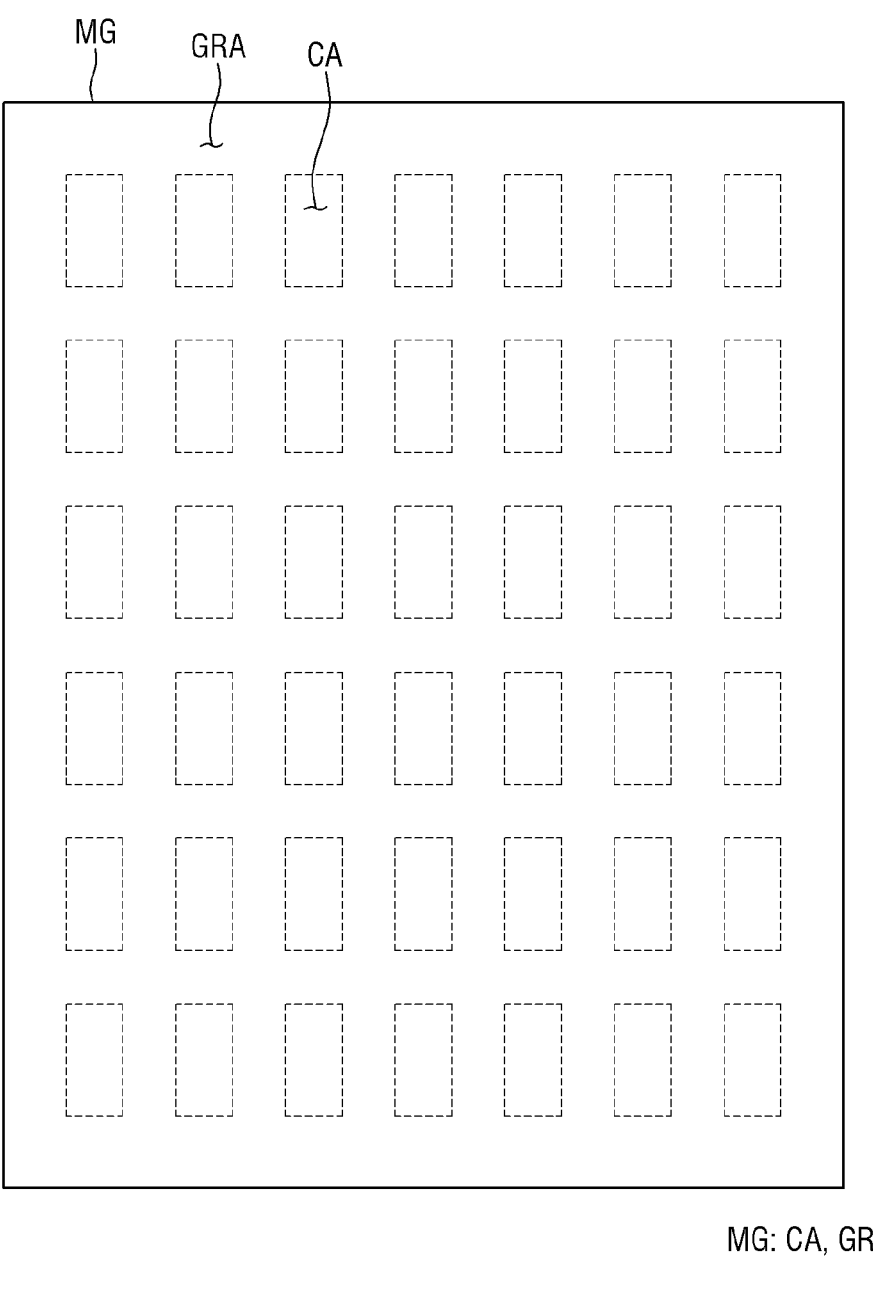
MG: CA, GRA
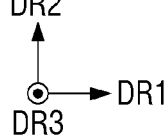

100': 110', 150', 170'

100: 110, 130, 150
MG: CA, GRA

DR2

DR1

DR3

EVA:300

100: 110, 150, 170

100: 110, 130, 150, 170

1_1

150   110   171   191      Q2

MG

C

150

130

DR2

DR3   DR1

101: 110, 130, 150, 171, 191

CDL3: 140
CDL4_1: 150, 110, 191

MOTHER SUBSTRATE FOR DISPLAY DEVICE AND MANUFACTURING METHOD OF DISPLAY DEVICE

CROSS-REFERENCE TO RELATED APPLICATION

This application claims priority from Korean Patent Application No. 10-2022-0008205 filed on Jan. 20, 2022 in the Korean Intellectual Property Office and all the benefits accruing therefrom under 35 U.S.C. 119, the contents of which in its entirety are herein incorporated by reference.

BACKGROUND

Technical Field

The present disclosure relates to a mother substrate for producing a plurality of display devices and a manufacturing method of the mother substrate.

Description of the Related Art

With the advancement of multimedia, importance of a display device has been enhanced. Accordingly, various types of display devices such as a liquid crystal display (LCD) device and an organic light emitting diode display (OLED) device have been developed.

Among the display devices, a self-light emitting display device includes a self-light emitting element, for example, an organic light emitting element. The self-light emitting element may include two electrodes facing each other, and a light emitting layer interposed between the two electrodes. When the self-light emitting element is an organic light emitting element, electrons and holes, which are provided from the two electrodes, are recombined in the light emitting layer to produce excitons, and the generated excitons may be changed from an excited state to a ground state to emit light.

The manufacture of display devices sometimes includes producing a plurality of cell areas for a plurality of display devices in each cell area of the plurality of cell areas provides a cell area for a display device.

SUMMARY

According to the embodiments of the present disclosure, a mother substrate for producing cell areas for display devices in which each cell area provides a cell area for a display device may be provided, which may prevent arcing from occurring during a process.

According to the embodiments of the present disclosure, a manufacturing method of a mother substrate for producing cell areas for display devices in which each cell area provides a cell area for a display area of a display device provides improved image quality for the display devices.

The effects according to the embodiments of the present disclosure are not limited to those mentioned above and various effects are included in the following description.

According to an embodiment, a mother substrate for producing a plurality of cell areas for display devices comprises a base substrate including a plurality of cell areas, and a ground area surrounding each of the plurality of cell areas are defined; a ground line disposed to surround an edge of each of the plurality of cell areas on the ground area; a ground pad disposed to be spaced apart from the ground line on the ground area; and a ground connection electrode disposed on one surface of the ground line and one surface of the ground pad to electrically connect the ground line with the ground pad, wherein each cell area of the plurality of cell areas includes a light emitting element and a thin film transistor disposed on light emitting element.

In an embodiment, the light emitting element and the thin film transistor are electrically insulated from the ground line, the ground pad and the ground connection electrode.

In an embodiment, the light emitting element and the thin film transistor are electrically connected to each other by a connection electrode disposed between the light emitting element and the thin film transistor, and the ground line and the ground pad comprise the same material as that of the connection electrode.

In an embodiment, the light emitting element comprises an anode electrode disposed on the connection electrode and electrically connected to the connection electrode, and the anode electrode and the ground connection electrode comprise the same material.

In an embodiment, a mother substrate for a display device may further comprise a first via insulating layer disposed between the thin film transistor and the connection electrode in the cell area and extended to the ground area, wherein the connection electrode is disposed directly on one surface of the first via insulating layer in the cell area, and the ground line and the ground pad are disposed directly on one surface of the first via insulating layer in the ground area.

In an embodiment, the ground line and the ground pad are spaced apart from each other on the first via insulating layer to form a floating.

In an embodiment, a mother substrate for a display device may further comprise a second via insulating layer disposed between the connection electrode and the anode electrode in the cell area and extended to the ground area, wherein the anode electrode is disposed directly on one surface of the second via insulating layer in the cell area, and the ground connection electrode is disposed directly on one surface of the second via insulating layer in the ground area.

In an embodiment, the ground connection electrode is electrically connected to the ground line through a first contact hole, which passes through the second via insulating layer, in the ground area, and is electrically connected to the ground pad through a second contact hole that is spaced apart from the first contact hole and passes through the second via insulating layer.

In an embodiment, the second via insulating layer exposes a portion of the ground pad.

According to an embodiment, a mother substrate for producing display devices comprises a base and a ground area surrounding each of the plurality of cell areas are defined; a ground line disposed to surround an edge of each of the plurality of cell areas on the ground area; a first ground pad that is directly in contact with the ground line on the ground area and electrically connected to the ground line; a second ground pad that is directly in contact with the ground line on the ground area and electrically connected to the ground line; and a ground pad connection electrode that is directly in contact with the first ground pad and the second ground pad and electrically connecting the first ground pad with the second ground pad, wherein each cell area of the plurality of cell areas includes a light emitting element and a thin film transistor disposed on the light emitting element, wherein the first ground pad and the second ground pad are spaced apart from each other with the ground pad connection electrode interposed therebetween.

In an embodiment, the light emitting element and the thin film transistor are electrically insulated from the ground line, the ground pad and the ground pad connection electrode.

In an embodiment, the light emitting element and the thin film transistor are electrically connected to each other by a connection electrode disposed between the light emitting element and the thin film transistor, and the ground line, the ground pad and the ground pad connection electrode comprise the same material as that of the connection electrode.

In an embodiment, a mother substrate for a display device may further comprise a first via insulating layer disposed between the thin film transistor and the connection electrode in the cell area and extended to the ground area, wherein the connection electrode is disposed directly on one surface of the first via insulating layer in the cell area, and the ground line, the ground pad and the ground pad connection electrode are disposed directly on one surface of the first via insulating layer in the ground area.

In an embodiment, the ground line, the ground pad and the ground pad connection electrode are integrally formed.

In an embodiment, a mother substrate for a display device may further comprise a second via insulating layer disposed on the connection electrode in the cell area and extended to the ground area, wherein the second via insulating layer covers the ground line and the ground pad in the ground area.

In an embodiment, the second via insulating layer completely covers the ground line, and exposes a portion of the ground pad.

According to an embodiment, a manufacturing method of a plurality of display devices comprises preparing a base substrate that includes a plurality of cell areas and a ground area surrounding the cell areas; forming a thin film transistor in each cell area of the plurality of cell areas; forming a connection electrode disposed on the thin film transistor of the cell area and a ground material layer disposed on the ground area; forming a ground line and a ground pad by etching the ground material layer; and forming an anode electrode disposed on the connection electrode of the cell area and a ground connection electrode disposed on one surface of the ground line of the ground area and one surface of the ground pad.

In an embodiment, the connection electrode, the ground line and the ground pad comprise the same material.

In an embodiment, the anode electrode and the ground connection electrode comprise the same material.

In an embodiment, a manufacturing method of a display device may further comprise depositing a light emitting layer on the anode electrode after forming the anode electrode and the ground connection electrode.

BRIEF DESCRIPTION OF THE DRAWINGS

The above and other aspects and features of the disclosure will become more apparent by describing in detail embodiments thereof with reference to the attached drawings, in which:

FIG. 3 is a schematic circuit view illustrating a pixel disposed in a cell of a mother substrate for a display device according to the embodiment of FIG. 1;

FIGS. 7, 8, 9, 10, 11, 12, 13, 14, 15, 16, 17, 18, 19, 20, 21, 22, 23, and 24 are views illustrating a manufacturing method of a mother substrate for producing display devices according to one embodiments;

DETAILED DESCRIPTION OF THE DISCLOSURE

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

Hereinafter, detailed embodiments of the disclosure will be described with reference to the accompanying drawings.

Figure 1:
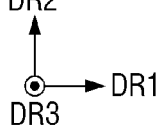
FIG. 1 is a schematic plan view illustrating a mother substrate for a display device according to one embodiment.
Figure 2:
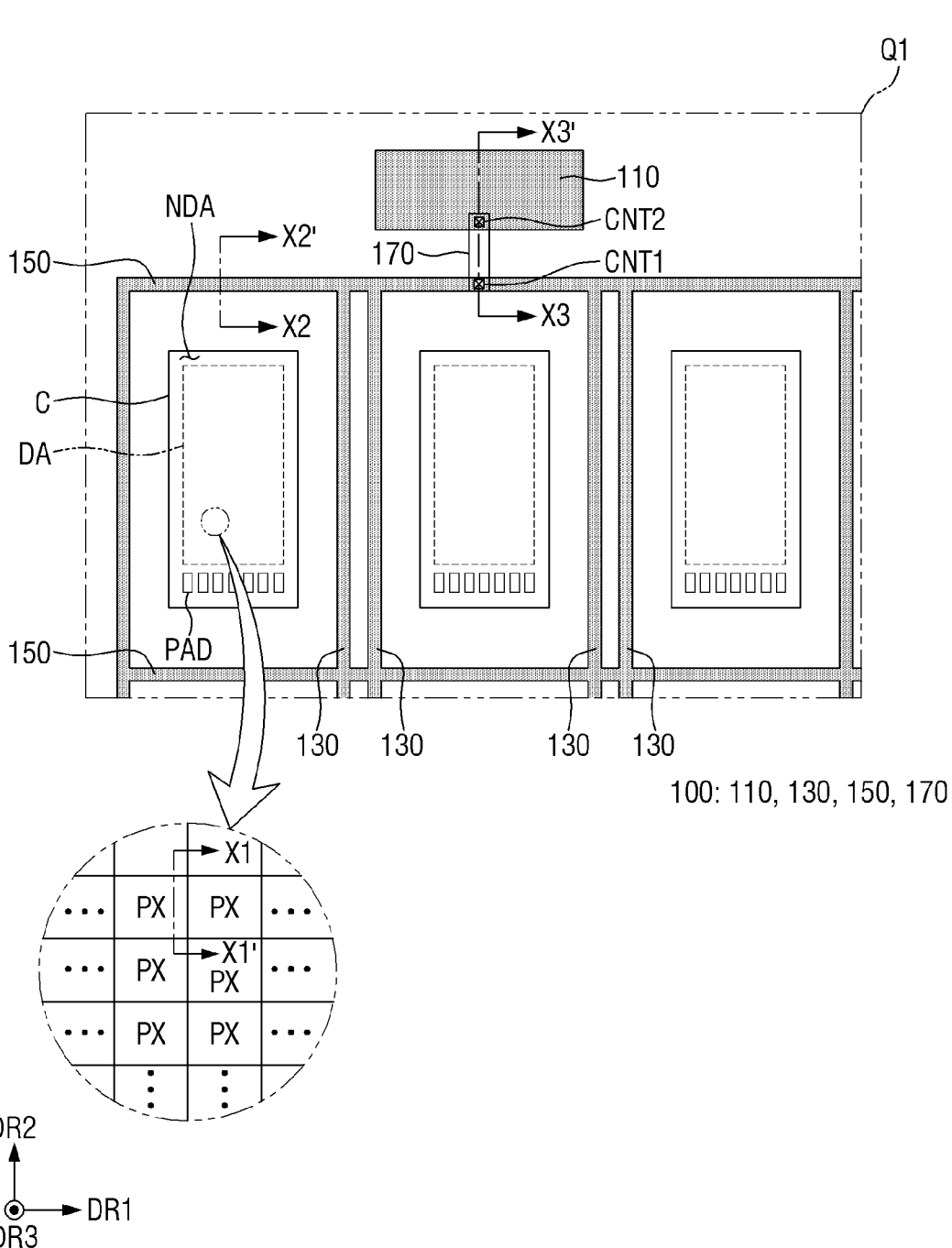
FIG. 2 is an enlarged view illustrating an area Q1 of FIG. 1.

FIG. 1 is a schematic plan view illustrating a mother substrate for a display device according to one embodiment of the disclosure. FIG. 2 is an enlarged view illustrating an area Q1 of FIG. 1.

In FIG. 1, a first direction DR1, a second direction DR2 and a third direction DR3 are defined. The first direction DR1 and the second direction DR2 may be perpendicular to each other, the first direction DR1 and the third direction DR3 may be perpendicular to each other, and the second direction DR2 and the third direction DR3 may be perpendicular to each other. It is to be understood that the first direction DR1 denotes a horizontal direction on the drawing, the second direction DR2 denotes a vertical direction on the drawing, and the third direction DR3 denotes upper and lower directions on the drawing. In the description below, unless otherwise specified, "direction" may refer to both directions that are directed toward both sides extended along the direction. In addition, when it is necessary to distinguish both "directions" extended to both sides, one side will be referred to as "one side direction" and the other side will be referred to as "the other side direction." Based on FIG. 1, a direction in which an arrow is directed will be referred to as one side, and its opposite direction will be referred to as the other side.

Referring to FIGS. 1 and 2, a mother substrate 1 for a display device according to one embodiment may include a base substrate MG, a plurality of cells C and a ground portion 100.

The base substrate MG may serve to constitute a base of the mother substrate 1 for the display device. When the base substrate MG is a flexible substrate having flexibility, the base substrate MG may include polyimide, but is not limited thereto. In addition, when the substrate is a rigid substrate having rigidity, the base substrate MG may include glass, but is not limited thereto.

In some embodiments, the base substrate MG may have a rectangular shape having a long side in the second direction DR2 and a short side in the first direction DR1, but is not limited thereto. For example, the base substrate MG may have a circular shape.

A plurality of cell areas CA and a ground area GRA surrounding each of the plurality of cell areas CA may be defined in the base substrate MG (see FIG. 8). The cells C may be disposed in each of the plurality of cell areas CA, and the ground portion 100 electrically insulated from the cell C may be disposed in the ground area GRA.

Each of the plurality of cells C respectively disposed in the plurality of cell areas CA is obtained by a display device, and the display area DA in which the plurality of pixels PX are disposed and the non-display area NDA surrounding the display area DA may be defined in each of the cells C.

A thin film transistor and a light emitting element, which constitute a pixel PX, may be disposed in the display area DA of each of the plurality of cells C, and a plurality of pads PAD (for example, data pads) for providing an electrical signal to the pixel PX of the display area DA may be disposed in the non-display area NDA.

The plurality of cells C may be spaced apart from each other and arranged in a lattice pattern. In some embodiments, the respective cells C may be arranged to be spaced apart from each other in parallel in the first direction DR1 and the second direction DR2, but are not limited thereto. Each of the plurality of cells C will be obtained by an individual display device through a cutting process that will be described later.

The ground portion 100 may include ground lines 130 and 150, a ground pad 110, and a ground connection electrode 170.

The ground lines 130 and 150 of the ground portion 100 may serve to provide a path for discharging static electricity that may occur during a deposition process of the light emitting layer, which will be described later. The ground lines 130 and 150 may be disposed to surround an outer periphery of each of the plurality of cells C. In other words, the ground lines 130 and 150 may be disposed to surround the outer periphery of each of the plurality of cells C while being spaced apart from and electrically insulated from each of the plurality of cells C.

The ground lines 130 and 150 may include a plurality of first ground lines 130 extended in the second direction DR2 and a plurality of second ground lines 150 extended in the first direction DR1. The plurality of first ground lines 130 may be electrically connected to the plurality of second ground lines 150 at a mutual crossing point. In some embodiments, the plurality of first ground lines 130 and the plurality of second ground lines 150 may be integrally formed, but are not limited thereto.

Each of the plurality of first ground lines 130 may be extended in the second direction DR2, and may be disposed to be spaced apart from each other in the first direction DR1. The plurality of first ground lines 130 may surround outer peripheries of both sides of each of the plurality of cells C in the first direction DR1. In other words, the plurality of first ground lines 130 may be disposed on outer peripheries of both sides of each of the plurality of cells C in the first direction DR1, and may be spaced apart from a boundary of both sides of each of the plurality of cells C in the first direction DR1.

The plurality of second ground lines 150 may be extended in the first direction DR1, and may be disposed to be spaced apart from each other in the second direction DR2. The plurality of second ground lines 150 may surround outer peripheries of both sides of each of the plurality of cells C in the second direction DR2. In other words, the plurality of second ground lines 150 may be disposed on outer peripheries of both sides of each of the plurality of cells C in the second direction DR2, and may be spaced apart from a boundary of both sides of each of the plurality of cells C in the second direction DR2.

Figure 20:
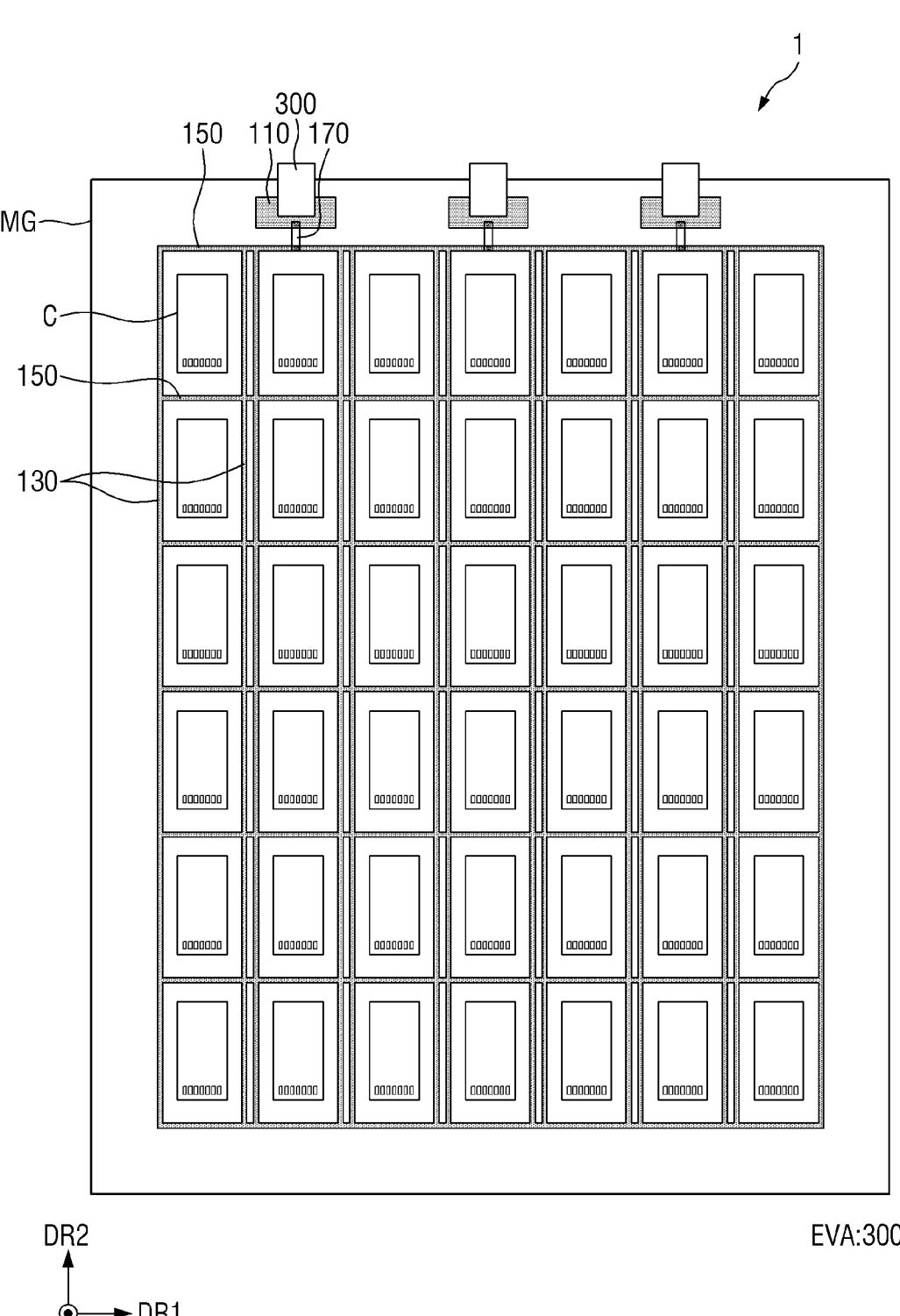

The ground pad 110 of the ground portion 100 may be electrically connected to a discharge electrode 300 (FIG. 20) of a deposition apparatus, which performs the deposition process of the light emitting layer, as described below, to discharge static electricity that may occur during the deposition process of the light emitting layer. The ground pad 110 may have a large width as compared with the ground lines 130 and 150, and may be disposed to be spaced apart from the ground lines 130 and 150.

The ground pad 110 may be disposed near an edge of the base substrate MG. In some embodiments, the ground pad 110 may be disposed to be away from the edge of the base substrate MG as much as 11 mm, but is not limited thereto.

The ground pad 110 may be disposed as a plurality of ground pads 110. When the plurality of ground pads 110 are disposed, the respective ground pads 110 may be spaced apart from each other. Although FIG. 1 shows that three ground pads 110 are disposed, this is only exemplary, and the number of the ground pads 110 is not limited thereto.

The ground connection electrode 170 of the ground portion 100 may serve to electrically connect the ground pad 110 with the ground lines 130 and 150.

In some embodiments, the ground pad 110 may be electrically connected to the second ground line 150 through the ground connection electrode 170, but is not limited thereto. For example, the ground pad 110 may be electrically connected to the first ground line 130 through the ground connection electrode 170. Hereinafter, for convenience of description, the description will be based on that the ground pad 110 is electrically connected to the second ground line 150 through the ground connection electrode 170. In this case, as shown in FIG. 2, the ground connection electrode 170 may be connected to the second ground line 150 through a first contact hole CNT1, and may be connected to the ground pad 110 through a second contact hole CNT2 to electrically connect the second ground line 150 with the ground pad 110.

Hereinafter, a circuit structure of the pixel PX will be described.

Figure 3:
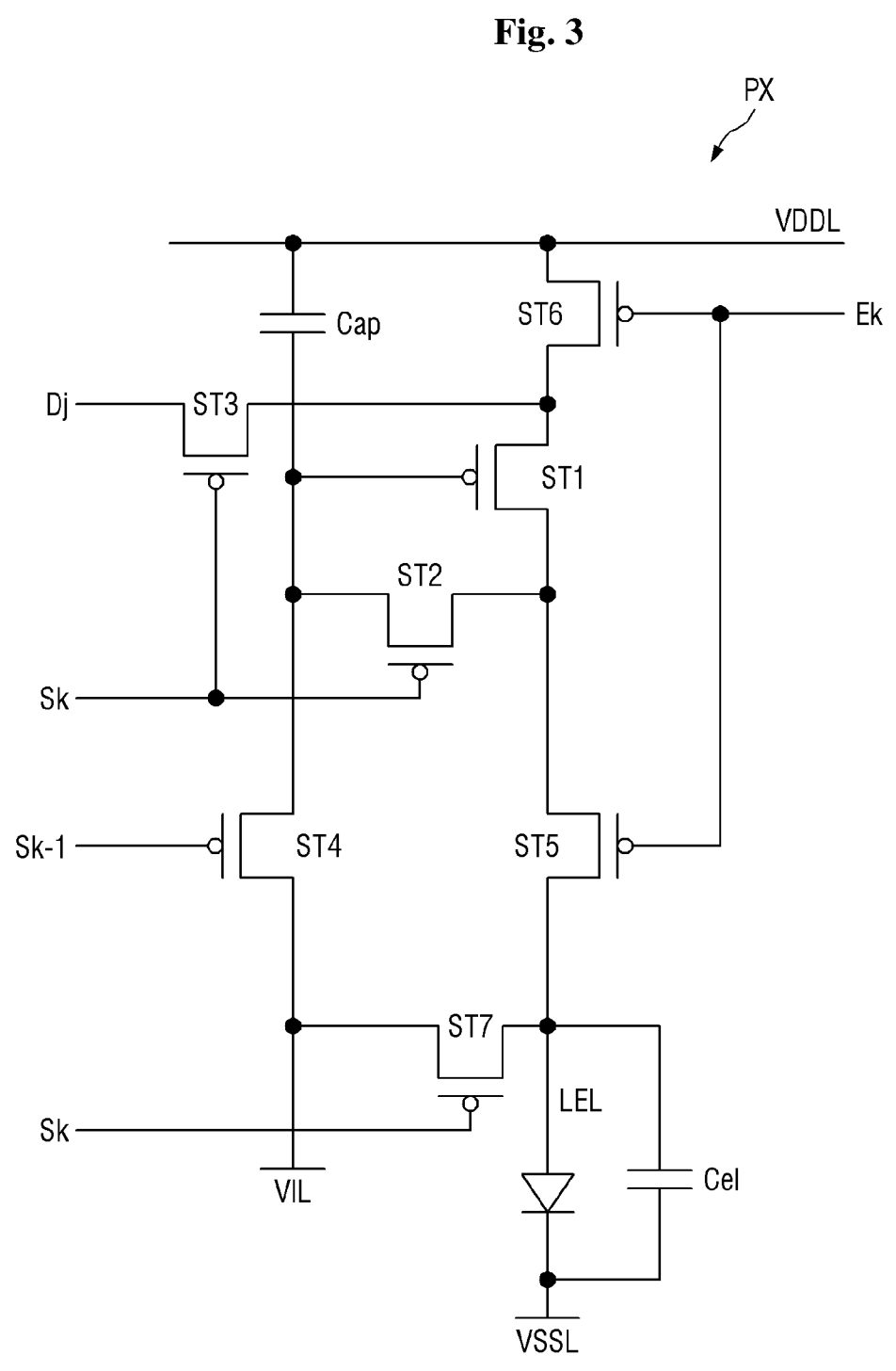

FIG. 3 is a schematic circuit view illustrating a pixel disposed in a cell of a mother substrate for a display device according to the embodiment of FIG. 1.

Referring to FIG. 3, the pixel PX may be connected to a (k−1)th scan line Sk−1, a (k)th scan line Sk and a (j)th data line Dj, wherein k and j may be natural numbers greater or equal to 1. The pixel PX may be connected to a first driving voltage line VDDL to which a first driving voltage is applied, an initialization voltage line VIL to which an initialization voltage is applied, and a second driving voltage line VSSL to which a second driving voltage lower than the first driving voltage is applied. In addition, the pixel PX includes a thin film transistor, a light emitting element LEL, and a capacitor. The thin film transistor includes a driving transistor and a switching transistor. The driving transistor may receive the first driving voltage or the second driving voltage to supply a driving current to the light emitting element LEL, and the switching transistor SW may transfer a data signal to the driving transistor. The pixel PX may include a first thin film transistor ST1 as the driving transistor DT, may include a second thin film transistor ST2, a third thin film transistor ST3, a fourth thin film transistor ST4, a fifth thin film transistor ST5, a sixth thin film transistor ST6 and a seventh thin film transistor ST7 as switching thin film transistors, and may include a light emitting layer EML as the light emitting element LEL.

The first thin film transistor ST1 may include a first gate electrode, a first semiconductor pattern layer, a first electrode, and a second electrode. The first thin film transistor ST1 controls a drain-source current flowing between the first electrode and the second electrode in accordance with a data voltage applied to the first gate electrode. The driving current flowing through a channel of the first thin film transistor ST1 is proportional to square of a difference between a voltage between the first gate electrode and the first electrode and a threshold voltage of the first thin film transistor ST1 as expressed in Equation 1.

$$Ids = k' \times (Vgs - Vth)^2 \qquad \text{[Equation 1]}$$

In Equation 1, k' denotes a proportional coefficient determined by a structure and physical characteristics of the first thin film transistor ST1, Vgs denotes a gate-source voltage of the first thin film transistor ST1, Vth denotes a threshold voltage of the first thin film transistor ST1, and Ids denotes a driving current.

Figure 4:
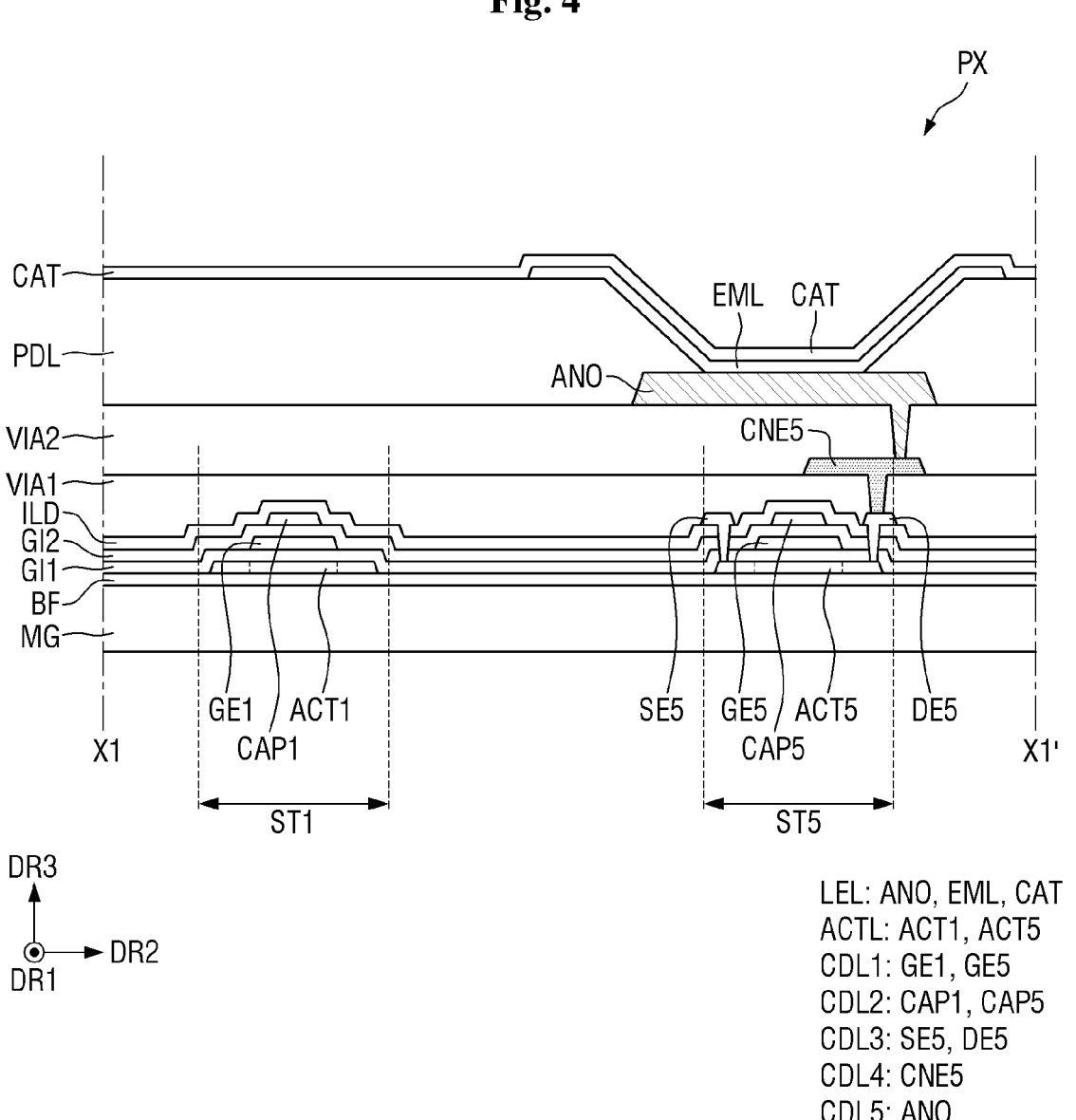
FIG. 4 is a schematic cross-sectional view taken along line X1-X1' of FIG. 2, specifically a detailed schematic cross-sectional view illustrating a pixel disposed in a cell of a mother substrate for a display device according to the embodiment of FIG. 1.

The light emitting element LEL may serve to emit light in accordance with the driving current. The light emitting amount of the light emitting element LEL may be proportional to the driving current. Referring to FIG. 4, the light emitting element LEL may include a first electrode, a second electrode and a light emitting layer disposed between the first electrode and the second electrode. The first electrode may be an anode electrode, and the second electrode may be a cathode electrode.

The first electrode of the light emitting element LEL is connected to a first electrode of the seventh thin film transistor ST7 and a second electrode of the fifth thin film transistor ST5, which will be described later, and the second electrode may be connected to the second driving voltage line VSSL. In some embodiments, a parasitic capacitance Cel may be formed between the first electrode and the second electrode of the light emitting element LEL, but is not limited thereto. For example, the parasitic capacitance Cel between the first electrode and the second electrode of the light emitting element LEL may be omitted in accordance with an embodiment.

The second thin film transistor ST2 is turned on by a scan signal of the (k)th scan line Sk to connect the first gate electrode with the second electrode of the first thin film transistor ST1. That is, when the second thin film transistor ST2 is turned on, since the first gate electrode and the second electrode of the first thin film transistor ST1 are connected to each other, the first thin film transistor ST1 is driven as a diode. The second thin film transistor ST2 may include a second gate electrode, a second semiconductor pattern layer, a first electrode, and a second electrode. The second gate electrode may be connected to the (k)th scan line Sk, the first electrode of the second thin film transistor ST2 may be connected to the second electrode of the first thin film transistor ST1, and the second electrode of the second thin film transistor ST2 may be connected to the first gate electrode of the first thin film transistor ST1.

The third thin film transistor ST3 is turned on by the scan signal of the (k)th scan line Sk to connect the first electrode of the first thin film transistor ST1 with the (j)th data line Dj. The third thin film transistor ST3 may include a third gate electrode, a third semiconductor pattern layer, a first electrode, and a second electrode. The third gate electrode of the third thin film transistor ST3 may be connected to the (k)th scan line Sk, the first electrode of the third thin film transistor ST3 may be connected to the first electrode of the first thin film transistor ST1, and the second electrode of the third thin film transistor ST3 may be connected to the (j)th data line Dj.

The fourth thin film transistor ST4 is turned on by the scan signal of the (k−1)th scan line Sk−1 to connect the first gate electrode of the first thin film transistor ST1 with the initialization voltage line VIL. The first gate electrode of the first thin film transistor ST1 may be discharged to an initialization voltage of the initialization voltage line VIL. The fourth thin film transistor ST4 may include a fourth gate electrode, a fourth semiconductor pattern layer, a first electrode, and a second electrode. The fourth gate electrode of the fourth thin film transistor ST4 may be connected to the (k−1)th scan line Sk−1, the first electrode of the fourth thin film transistor ST4 may be connected to the first gate electrode of the first thin film transistor ST1, and the second electrode of the fourth thin film transistor ST4 may be connected to an initialization voltage line VIL.

The fifth thin film transistor ST5 is connected between the second electrode of the first thin film transistor ST1 and the first electrode of the light emitting element LEL. The fifth thin film transistor ST5 is turned on by a light emitting control signal of a (k)th light emission line Ek to connect the second electrode of the first thin film transistor ST1 with the first electrode of the light emitting element LEL. The fifth thin film transistor ST5 may include a fifth gate electrode, a fifth semiconductor pattern layer, a first electrode, and a second electrode. The fifth gate electrode of the fifth thin film transistor ST5 is connected to the (k)th light emission line Ek, the first electrode of the fifth thin film transistor ST5 is connected to the second electrode of the first thin film transistor ST1, and the second electrode of the fifth thin film transistor ST5 is connected to the first electrode of the light emitting element LEL.

The sixth thin film transistor ST6 is turned on by the light emitting control signal of the (k)th light emission line Ek to connect the first electrode of the first thin film transistor ST1 with the first driving voltage line VDDL. The sixth thin film transistor ST6 may include a sixth gate electrode, a sixth semiconductor pattern layer, a first electrode, and a second electrode. The sixth gate electrode of the sixth thin film transistor ST6 is connected to the (k)th light emission line Ek, the first electrode of the sixth thin film transistor ST6 is connected to the first driving voltage line VDDL, and the second electrode of the sixth thin film transistor ST6 is connected to the first electrode of the first thin film transistor ST1. When the fifth thin film transistor ST5 and the sixth thin film transistor ST6 are turned on, the driving current may be supplied to the light emitting element LEL.

The seventh thin film transistor ST7 is turned on by the scan signal of the (k)th scan line Sk to connect the first electrode of the light emitting element LEL with the initialization voltage line VIL. The first electrode of the light emitting element LEL may be discharged to the initialization voltage. The seventh thin film transistor ST7 may include a seventh gate electrode, a seventh semiconductor pattern layer, a first electrode and a second electrode. The seventh gate electrode of the seventh thin film transistor ST7 is connected to the (k)th scan line Sk, the first electrode of the seventh thin film transistor ST7 is connected to the first electrode of the light emitting element LEL, and the second electrode of the seventh thin film transistor ST7 is connected to the initialization voltage line VIL.

A capacitor Cap is formed between the first gate electrode of the first thin film transistor ST1 and the first driving voltage line VDDL. One electrode of the capacitor Cap may be connected to the first gate electrode of the first thin film transistor ST1, and the other electrode thereof may be connected to the first driving voltage line VDDL.

When the first electrode of each of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7 is a source electrode, the second electrode may be a drain electrode. Alternatively, when the first electrode of each of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7 is a drain electrode, the second electrode may be a source electrode.

Each of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7 may include a semiconductor pattern layer as described above. Each of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7 may include a semiconductor pattern layer made of polycrystalline silicon, but is not limited thereto.

When the semiconductor pattern layer of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7 is made of polycrystalline silicon, a process for forming the semiconductor pattern layer may be a low temperature polycrystalline silicon process. In FIG. 3, all of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7 may be formed of p-type thin film transistors, but are not limited thereto, and some or all of them may be formed of n-type thin film transistors.

Hereinafter, a stacked structure of the pixel PX disposed in the display area DA of the cell C will be described.

FIG. 4 is a schematic cross-sectional view taken along line X1-X1' of FIG. 2, specifically a detailed schematic cross-sectional view illustrating a pixel disposed in a cell of a mother substrate for a display device according to the embodiment of FIG. 1.

Referring to FIG. 4 in addition to FIG. 3, the pixel PX of the cell C (see FIG. 2) may include a base substrate MG, a buffer layer BF, a semiconductor layer ACTL, a first gate insulating layer GI1, a first conductive layer CDL1, a second gate insulating layer GI2, a second conductive layer CDL2, an interlayer dielectric layer ILD, a third conductive layer CDL3, a first via insulating layer VIA1, a fourth conductive layer CDL4, a second via insulating layer VIA2, a fifth conductive layer CDL5, a pixel defining layer PDL, a light emitting layer EML, and a cathode electrode CAT.

Since the base substrate MG is a base of the mother substrate 1 for the display device, the base substrate MG may serve to constitute a base of the ground portion 100 as well as the cell C. As described above, when the base substrate MG has flexibility, the base substrate MG may include polyimide, but is not limited thereto. In addition, when the base substrate MG has rigidity, the base substrate MG may include glass, but is not limited thereto.

The buffer layer BF may serve to prevent metal atoms or impurities from being diffused from the base substrate MG to the semiconductor layer ACTL disposed in the display area DA of the cell C. The buffer layer BF may be disposed entirely on the base substrate MG.

The semiconductor layer ACTL may be disposed on the buffer layer BF in the display area DA of the cell C to receive a signal from the scan line and the data line, thereby transferring the signal to the first electrode and the second electrode of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7. Hereinafter, the first electrode of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7 may be a source electrode, and the second electrode thereof may be a drain electrode. The semiconductor layer ACTL may not be disposed in the ground area GRA.

The semiconductor layer ACTL may include a semiconductor pattern layer of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7. For example, as shown in FIG. 4, the first thin film transistor ST1 includes a first semiconductor pattern layer ACT1, and the fifth transistor includes a fifth semiconductor pattern layer ACT5.

The first semiconductor pattern layer ACT1 includes a first channel area that overlaps a first gate electrode GE1, which will be described later, a first drain area positioned on one side of the first channel area, and a first source area positioned on the other side of the first channel area. The fifth semiconductor pattern layer ACT5 may include a fifth channel area that overlaps a fifth gate electrode GE5, which will be described later, a fifth drain area positioned on one side of the fifth channel area, and a fifth source area positioned on the other side of the fifth channel area.

The semiconductor layer ACTL may be positioned directly on one surface of the buffer layer BF. That is, the semiconductor layer ACTL may be directly in contact with one surface of the buffer layer BF. The semiconductor layer ACTL may be selectively patterned on the buffer layer BF. In some embodiments, the semiconductor layer ACTL may include polycrystalline silicon, but is not limited thereto. For example, the semiconductor layer ACTL may include amorphous silicon or an oxide semiconductor.

The first gate insulating layer GI1 may serve to insulate the semiconductor layer ACTL from the first conductive layer CDL1 that will be described later. The first gate insulating layer GI1 may be disposed on the buffer layer BF, in which the semiconductor layer ACTL is disposed, to cover the semiconductor layer ACTL. The first gate insulating layer GI1 may be disposed along a profile of the semiconductor layer ACTL. The first gate insulating layer GI1 may be disposed entirely on the buffer layer BF. In some embodiments, the first gate insulating layer GI1 may include an inorganic insulating material.

The first conductive layer CDL1 may be disposed on the first gate insulating layer GI1. The first conductive layer CDL1 may be positioned directly on one surface of the first gate insulating layer GI1. That is, the first conductive layer CDL1 may be directly in contact with one surface of the first gate insulating layer GI1. The first conductive layer CDL1 may not be disposed in the ground area GRA.

The first conductive layer CDL1 may include a gate electrode of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7, which are disposed in the display area DA. For example, the first conductive layer CDL1 may include a first gate electrode GE1 of the first thin film transistor ST1 and a fifth gate electrode GE5 of the fifth thin film transistor ST5, as shown in FIG. 4. As described above, the first gate electrode GE1 and the fifth gate electrode GE5 may overlap the first channel area of the first semiconductor pattern layer ACT1 and the fifth channel area of the fifth semiconductor pattern layer ACT5 in the third direction DR3, respectively.

The first conductive layer CDL1 may include metal. For example, the first conductive layer CDL1 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The second gate insulating layer GI2 may serve to insulate the first conductive layer CDL1 from the second conductive layer CDL2 that will be described later. The second gate insulating layer GI2 may be disposed on the first gate insulating layer GI1, in which the first conductive layer CDL1 is disposed, to cover the first conductive layer CDL1. The second gate insulating layer GI2 may be disposed at a thickness substantially the same as that of the first conductive layer CDL1 along a profile of the first conductive layer CDL1. In some embodiments, the second gate insulating layer GI2 includes an inorganic insulating material, and may be formed of a plurality of layers.

The second conductive layer CDL2 may be disposed on the second gate insulating layer GI2. The second conductive layer CDL2 may be positioned directly on one surface of the second gate insulating layer GI2. That is, the second conductive layer CDL2 may be directly in contact with one surface of the second gate insulating layer GI2. The second conductive layer CDL2 may not be disposed in the ground area GRA.

The second conductive layer CDL2 may include a capacitor electrode disposed in the display area DA. For example, as shown in FIG. 4, the second conductive layer CDL2 may include a first capacitor electrode CAP1 of the first thin film transistor ST1 and a fifth capacitor electrode CAP5 of the fifth thin film transistor ST5. A voltage the same as that applied to the first driving voltage line VDDL (see FIG. 3) may be applied to the first capacitor electrode CAP1.

The first capacitor electrode CAP1 may form a capacitor together with the first gate electrode GE1 and the second gate insulating layer GI2. The first capacitor electrode CAP1 may overlap the first gate electrode GE1 in the third direction DR3. The fifth capacitor electrode CAP5 may form a capacitor together with the fifth gate electrode GE 5 and the second gate insulating layer GI2. The fifth capacitor electrode CAP5 may overlap the fifth gate electrode GE5 in the third direction DR3.

The second conductive layer CDL2 may include metal. For example, the second conductive layer CDL2 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The interlayer dielectric layer ILD may serve to insulate the second conductive layer CDL2 from the third conductive layer CDL3 that will be described later. The interlayer dielectric layer ILD may be disposed on the second gate insulating layer GI2 in which the second conductive layer CDL2 is formed. The interlayer dielectric layer ILD may include an inorganic insulating material or an organic insulating material. The interlayer dielectric layer ILD may be formed of a single layer, but is not limited thereto. In some other embodiments, the interlayer dielectric layer ILD may be formed of a plurality of layers.

The third conductive layer CDL3 may be disposed on the interlayer dielectric layer ILD. The third conductive layer CDL3 may include a source electrode and a drain electrode of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7. For example, as shown in FIG. 4, the third conductive layer CDL3 may include a fifth source electrode SE5 and a fifth drain electrode DE5 of the fifth transistor.

When the source electrode and the drain electrode are formed on the interlayer dielectric layer ILD as the third conductive layer CDL3 is disposed, the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7 may be defined. The fifth source electrode SE5 and the fifth drain electrode DE5 may be electrically connected to the fifth source/drain areas of the fifth semiconductor pattern through a contact hole formed by passing through the interlayer dielectric layer ILD, the second gate insulating layer GI2 and the first gate insulating layer GI1.

The third conductive layer CDL3 may include metal. For example, the third conductive layer CDL3 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). In some embodiments, the third conductive layer CDL3 may have a multi-layered structure, for example, the third conductive layer CDL3 may have a two-layered structure of Ti/Al or a three-layered structure of Ti/Al/Ti.

The first via insulating layer VIA1 may serve to partially insulate the third conductive layer CDL3 from the fourth conductive layer CDL4 that will be described later. In the display area DA, the first via insulating layer VIA1 may be disposed on the interlayer dielectric layer ILD in which the third conductive layer CDL3 is formed. The first via insulating layer VIA1 may be formed using an organic insulating material such as an acrylic resin, a polyimide-based resin and a polyamide-based resin.

The fourth conductive layer CDL4 may be disposed on the first via insulating layer VIA1. The fourth conductive layer CDL4 may include a connection electrode electrically connected to the source electrode or the drain electrode of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7, an initialization voltage line, etc. For example, as shown in FIG. 4, the fourth conductive layer CDL4 may include a fifth connection electrode CNE5 electrically connected to the fifth drain electrode DE5. The fifth connection electrode CNE5 may be electrically connected to the fifth drain electrode DE5 through a contact hole formed by passing through the first via insulating layer VIA1.

The fourth conductive layer CDL4 may further include ground lines 130 and 150 and a ground pad 110 of the ground portion 100 in the ground area GRA. A detailed description of the elements of the fourth conductive layer CDL4 will be described later.

The fourth conductive layer CDL4 may include metal. For example, the fourth conductive layer CDL4 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). In some embodiments, the fourth conductive layer CDL4 may have a multi-layered structure, for example, the fourth conductive layer CDL4 may have a two-layered structure of Ti/Al or a three-layered structure of Ti/Al/Ti.

The second via insulating layer VIA2 may be disposed on the first via insulating layer VIA1, in which the fourth conductive layer CDL4 is formed, in the display area DA. The second via insulating layer VIA2 may be formed using an organic insulating material, such as an acrylic resin, a polyimide-based resin and a polyamide-based resin, in the same manner as the first via insulating layer VIA1. One side of the second via insulating layer VIA2 in the third direction DR3 may be an upper surface on which the anode electrode ANO of the light emitting element LEL is disposed, and the other side of the second via insulating layer VIA2 in the third direction DR3 may be a bottom surface on which the first via insulating layer VIA1 is disposed.

The fifth conductive layer CDL5 may include an anode electrode ANO of the light emitting element LEL disposed in the cell C and a ground connection electrode 170 of the ground portion 100. The fifth conductive layer CDL5 may be disposed directly on the upper surface of the second via insulating layer VIA2. A detailed description of the ground connection electrode 170 of the ground portion 100 will be described later.

In some embodiments, the fifth conductive layer CDL5 may have a multi-layered structure of ITO/Ag/ITO, but is not limited thereto.

The light emitting element LEL may include an anode electrode ANO, a light emitting layer EML and a cathode electrode CAT, and may be disposed on the second via insulating layer VIA2.

As shown in FIG. 4, the anode electrode ANO of the light emitting element LEL may be electrically connected to the fifth connection electrode CNE5 through a contact hole formed by passing through the second via insulating layer VIA2, and thus may be electrically connected to the fifth drain electrode DE5 of the fifth thin film transistor ST5. One side of the anode electrode ANO in the third direction DR3 may be an upper surface on which the light emitting layer EML is disposed, and the other side of the anode electrode ANO in the third direction DR3 may be a bottom surface on which the second via insulating layer VIA2 is disposed.

The pixel defining layer PDL may be disposed on the second via insulating layer VIA2 in which the anode electrode ANO is disposed. The pixel defining layer PDL may be formed using an organic material or the like. The pixel defining layer PDL may form an opening that partially exposes the anode electrode ANO.

The light emitting layer EML may be disposed on the anode electrode ANO and the pixel defining layer PDL. When the light emitting layer EML is an organic light emitting layer that includes an organic material, the light emitting element LEL may be an organic light emitting diode. When the light emitting layer EML includes a quantum dot light emitting layer, the light emitting element LEL may be a quantum dot light emitting element. When the light emitting layer EML includes an inorganic semiconductor, the light emitting element LEL may be an inorganic light emitting element. Alternatively, the light emitting element LEL may be a micro-light emitting diode. Hereinafter, the description will be based on that the light emitting layer EML is an organic light emitting layer that includes an organic material.

The cathode electrode CAT may be disposed on the light emitting layer EML, and may have a thickness substantially the same as that of the pixel defining layer PDL along a profile of the pixel defining layer PDL. In some embodiments, the cathode electrode CAT may not be disposed in the ground area GRA.

A thin film encapsulation layer (not shown) for preventing external moisture and oxygen from being permeated into the light emitting element LEL and a touch layer (not shown) disposed on the thin film encapsulation layer to sense a touch input may be further disposed on the cathode electrode CAT.

Hereinafter, a stacked structure of the ground portion 100 disposed on the ground area GRA will be described.

Figure 5:
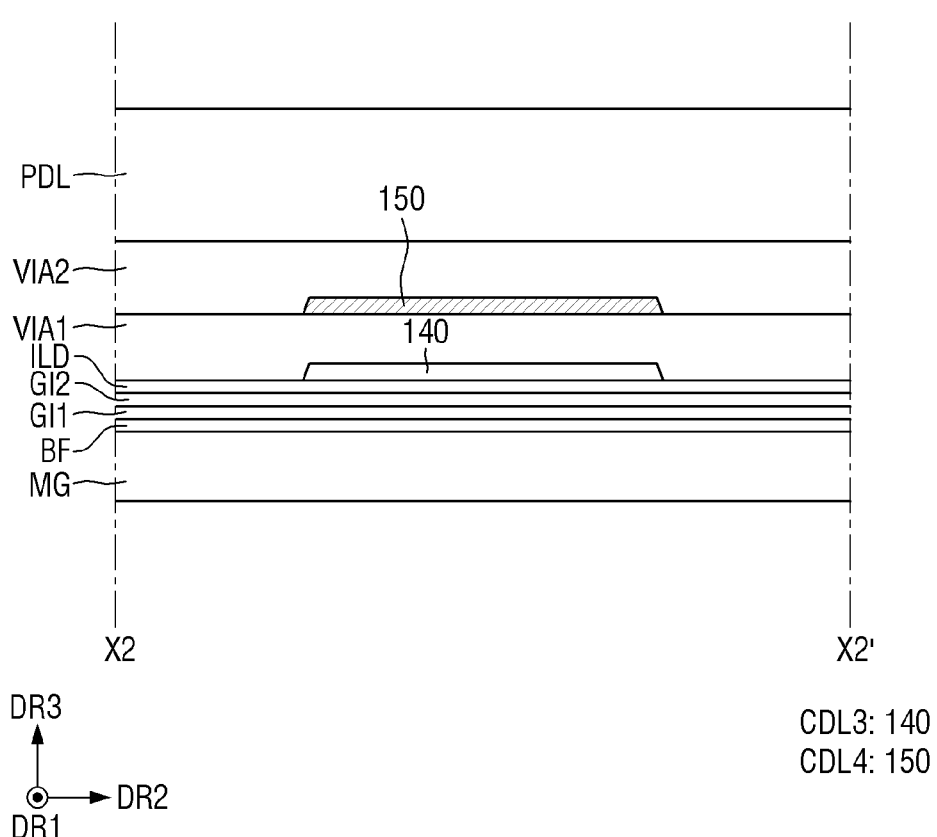
FIG. 5 is a schematic cross-sectional view taken along line X2-X2' of FIG. 2, specifically a schematic cross-sectional view illustrating a ground line according to the embodiment of FIG. 1.
Figure 6:
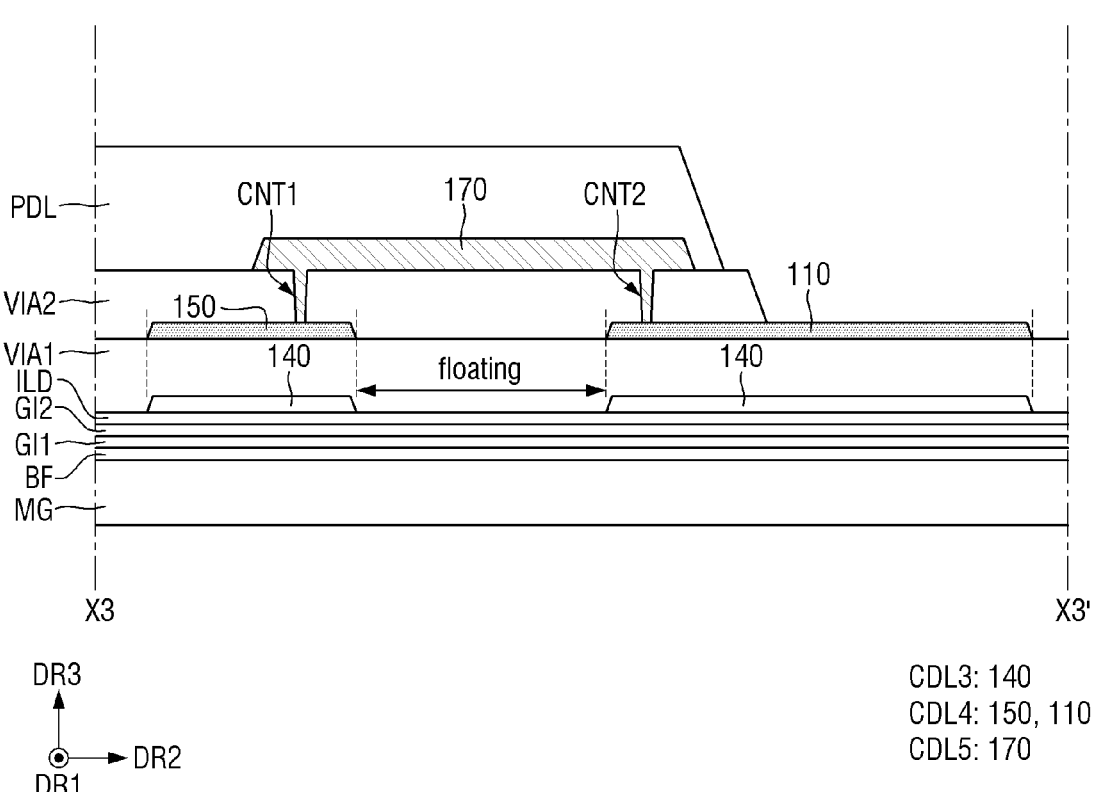
FIG. 6 is a schematic cross-sectional view taken along line X3-X3' of FIG. 2, specifically a cross-sectional view illustrating a connection relation of a ground line, a ground pad and a ground connection electrode according to the embodiment of FIG. 1.

FIG. 5 is a schematic cross-sectional view taken along line X2-X2' of FIG. 2, specifically a schematic cross-sectional view illustrating a ground line according to the embodiment of FIG. 1. FIG. 6 is a schematic cross-sectional view taken along line X3-X3' of FIG. 2, specifically a cross-sectional view illustrating a connection relation of a ground line, a ground pad and a ground connection electrode according to the embodiment of FIG. 1.

Referring to FIGS. 5 and 6 in addition to FIG. 4, the ground portion 100 may include a base substrate MG, a buffer layer BF, a first gate insulating layer GI1, a second gate insulating layer GI2, an interlayer dielectric layer ILD, a first via insulating layer VIA1, a fourth conductive layer CDL4, a second via insulating layer VIA2, a fifth conductive layer CDL5, and a pixel defining layer PDL. In other words, the semiconductor layer ACTL, the first conductive layer CDL1 and the second conductive layer CDL2, which are described with reference to FIG. 4, may not be disposed in the ground area GRA. Since the base substrate MG, the buffer layer BF, the first gate insulating layer GI1, the second gate insulating layer GI2, the interlayer dielectric layer ILD and the first via insulating layer VIA1 are the same as those described above, their detailed description will be omitted.

The third conductive layer CDL3 may include a lower electrode 140 disposed below the ground lines 130 and 150 and the ground pad 110, which will be described later, in the ground area GRA. In some embodiments, the lower electrode 140 may be disposed to overlap each of the ground lines 130 and 150 and the ground pad 110, but is not limited thereto.

The fourth conductive layer CDL4 may include ground lines 130 and 150 and a ground pad 110 in the ground area GRA.

The ground lines 130 and 150 may be disposed directly on the upper surface of the first via insulating layer VIA1. The ground lines 130 and 150 are electrically insulated from the cell C by being spaced apart from the cell C, and may surround the outer periphery of the cell C as described above (see FIG. 2).

The second via insulating layer VIA2 may be disposed on the second ground line 150. The second via insulating layer VIA2 may fully cover the second ground line 150. Although the second ground line 150 is shown in FIG. 5, since the first ground line 130 is substantially the same as or similar to the second ground line 150, its description will be omitted.

The ground pad 110 may be disposed directly on the upper surface of the first via insulating layer VIA1. The ground pad 110 may be disposed to be spaced apart from the ground lines 130 and 150. A gap space between the ground pad 110 and the ground lines 130 and 150 may be referred to as a floating. As the floating is formed, an arcing phenomenon that may occur during an etching process (see FIG. 16) of a ground material layer 100', which will be described later, may be avoided, and its detailed description will be described later. The second via insulating layer VIA2 may be disposed directly on the upper surface of the first via insulating layer VIA1 in the gap space between the ground pad 110 and the ground lines 130 and 150.

The second via insulating layer VIA2 may be disposed on the ground pad 110. The second via insulating layer VIA2 may expose a portion of the ground pad 110. In other words, the second via insulating layer VIA2 may be disposed to cover a portion of the other side of the ground pad 110 in the second direction DR2 based on FIG. 6, and may be disposed so as not to cover the other portion thereof. The pixel defining layer PDL disposed on the second via insulating layer VIA2 may be disposed so as not to cover a portion of the ground pad 110 exposed by the second via insulating layer VIA2.

A portion of the ground pad 110 exposed by the second via insulating layer VIA2 and the pixel defining layer PDL is in contact with the discharge electrode 300 of the deposition apparatus EVA of the light emitting layer, which will be described later, to make sure of a path through which static electricity is discharged. The detailed description will be described later.

The fifth conductive layer CDL5 may further include a ground connection electrode 170 in the ground area GRA.

The ground connection electrode 170 may serve to electrically connect the ground lines 130 and 150 with the ground pad 110, wherein the ground lines 130 and 150 and the ground pad 110 are spaced apart from each other. The ground connection electrode 170 may be disposed directly on the upper surface of the second via insulating layer VIA2. As shown in FIG. 6, the ground connection electrode 170 may be electrically connected to the second ground line 150 through a first contact hole CNT1 that passes through the second via insulating layer VIA2, and may be electrically connected to the ground pad 110 through a second contact hole CNT2 that is disposed to be spaced apart from the first contact hole CNT1 in the second direction DR2 and passes through the second via insulating layer VIA2. In other words, the ground connection electrode 170 may connect the ground lines 130 and 150 with the ground pad 110 in a pi($\pi$) shape.

The ground connection electrode 170 may electrically connect the ground line 130 and 150 with the ground pad 110, thereby making sure of a path capable of discharging static electricity that may occur during a deposition process of the light emitting layer, and its detailed description will be described later.

Hereinafter, a manufacturing method of a mother substrate 1 for a display device according to one embodiment of the disclosure will be described.

FIGS. 7 to 24 are views illustrating a manufacturing method of a display device by using a mother substrate 1 for the display device according to one embodiment of the disclosure. In detail, FIG. 9, FIG. 11, FIG. 17 and FIG. 21 are cross-sectional views per process, which are taken along lines X1-X1' of FIG. 2 and FIGS. 10, 12, 13, 14, 18 and 23 are cross-sectional views per process, which are taken along lines X3-X3' of FIG. 2.

Referring to FIG. 7, a manufacturing method of a display device using a mother substrate 1 for the display device according to one embodiment of the disclosure includes the steps of preparing a base substrate MG in which a cell area CA and a ground area GRA are defined (S100), disposing a thin film transistor on the cell area CA of the base substrate MG (S200), disposing a connection electrode on the thin film transistor of the cell area CA and disposing a ground material layer 100' in the ground area GRA (S300), forming ground lines 130 and 150, a ground pad 110 and floating by etching a floating area 170' between the ground lines 130 and 150 and the ground pad 110 of the ground material layer 100' (S400), dry-etching the ground lines 130 and 150 adjacent to the cell area CA (S500), forming a ground portion 100 by disposing an anode electrode ANO on the connection electrode of the cell area CA and disposing a ground connection electrode 170 connecting the ground lines 130 and 150 with the ground pad 110 on the ground area GRA (S600), connecting a discharge electrode 300 of a deposition apparatus EVA to the ground pad 110 of the ground portion 100 by using the deposition apparatus EVA and forming a light emitting element layer EML on the anode electrode ANO of the cell area CA (S700), and obtaining a cell C by cutting the cell area CA of the base substrate MG (S800).

Referring to FIG. 8, the base substrate MG is prepared, in which the cell area CA and the ground area GRA are defined. The cell area CA may be an area in which a cell C obtained by a separate display device is formed, and the ground area GRA may be an area where the ground portion 100, which does not remain in the display device, is disposed after a cutting process that will be described later. The ground area GRA may be an area surrounding the cell area CA. In other words, the ground area GRA may refer to an area except the cell area CA on the base substrate MG.

In some embodiments, the cell area CA may be arranged in parallel in the first direction DR1 and the second direction DR2 to form a lattice pattern, but is not limited thereto.

Figure 9:
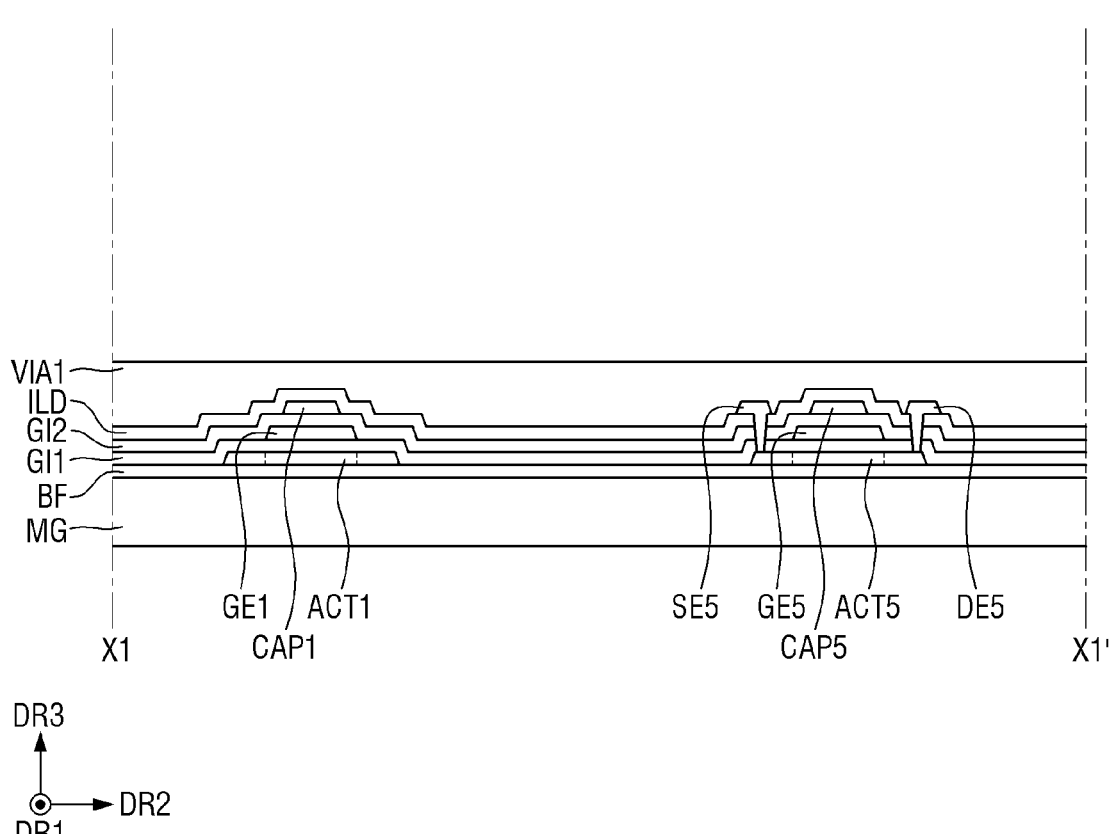
Figure 10:
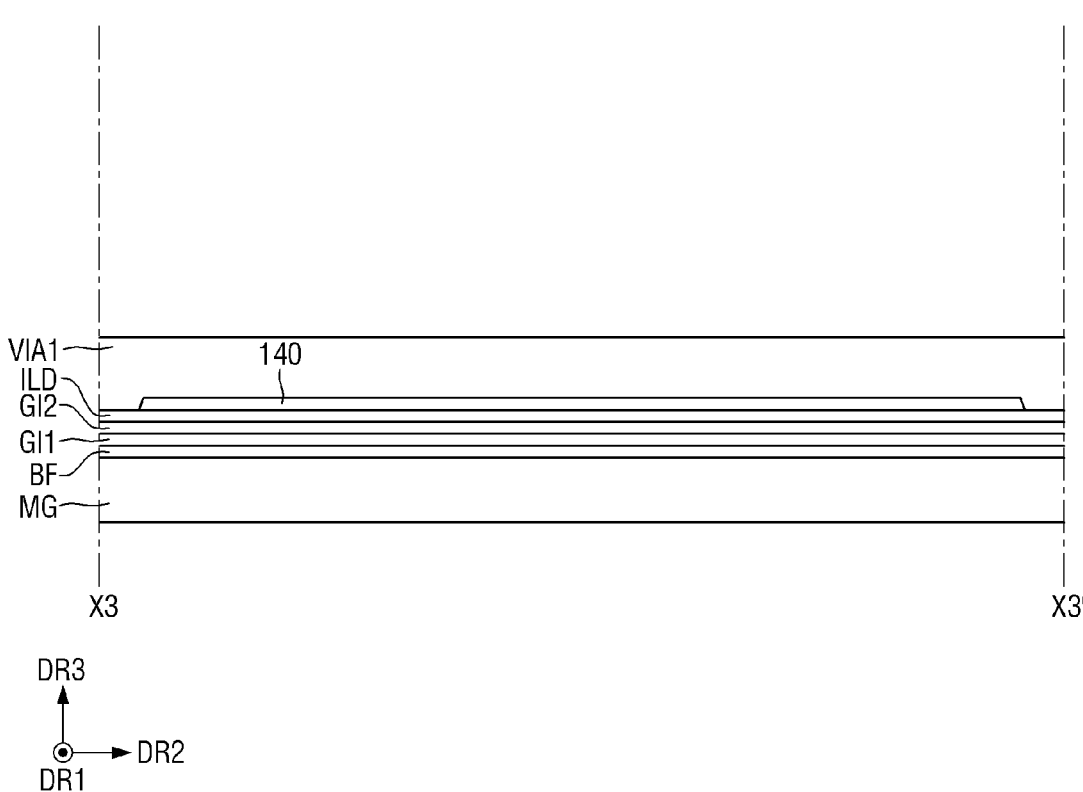

Referring to FIGS. 9 and 10, the buffer layer BF, the semiconductor layer ACTL, the first gate insulating layer GI1, the first conductive layer CDL1, the second gate insulating layer GI2, the second conductive layer CDL2, the interlayer dielectric layer ILD, the third conductive layer CDL3 and the first via insulating layer VIA1 are sequentially stacked on the base substrate MG.

In detail, in the display area DA of the cell C disposed in the cell area CA of the base substrate MG, a buffer layer BF, a first semiconductor area ACT1 and a fifth semiconductor area ACT1 on the buffer layer BF as semiconductor layers ACTL, a first gate insulating layer GI1 on the semiconductor layer ACTL, a first gate electrode GE1 and a fifth gate electrode GE5 on the first gate insulating layer GI1 as first conductive layers CDL1, a second gate insulating layer GI2 on the first conductive layer CDL1, a first capacitor electrode CAP1 and a fifth capacitor electrode CAP5 on the second gate insulating layer GI1 as second conductive layers CDL2, an interlayer dielectric layer ILD on the second conductive layer CDL2, a fifth source electrode SE5 and a fifth drain electrode DE5 on the interlayer dielectric layer ILD as third conductive layers CDL3, and a first via insulating layer VIA1 on the third conductive layer CDL3 may be sequentially formed.

In addition, in the ground area GRA of the base substrate MG, a buffer layer BF, a first gate insulating layer GI1 on the buffer layer BF, a second gate insulating layer GI2 on the first gate insulating layer GI1, an interlayer dielectric layer ILD on the second gate insulating layer GI2, a third conductive layer CDL3 on the interlayer dielectric layer ILD, and a first via insulating layer VIA1 on the third conductive layer CDL3 may be sequentially formed.

Since the detailed process of forming the aforementioned elements is well known in the art, its detailed description will be omitted.

Figure 11:
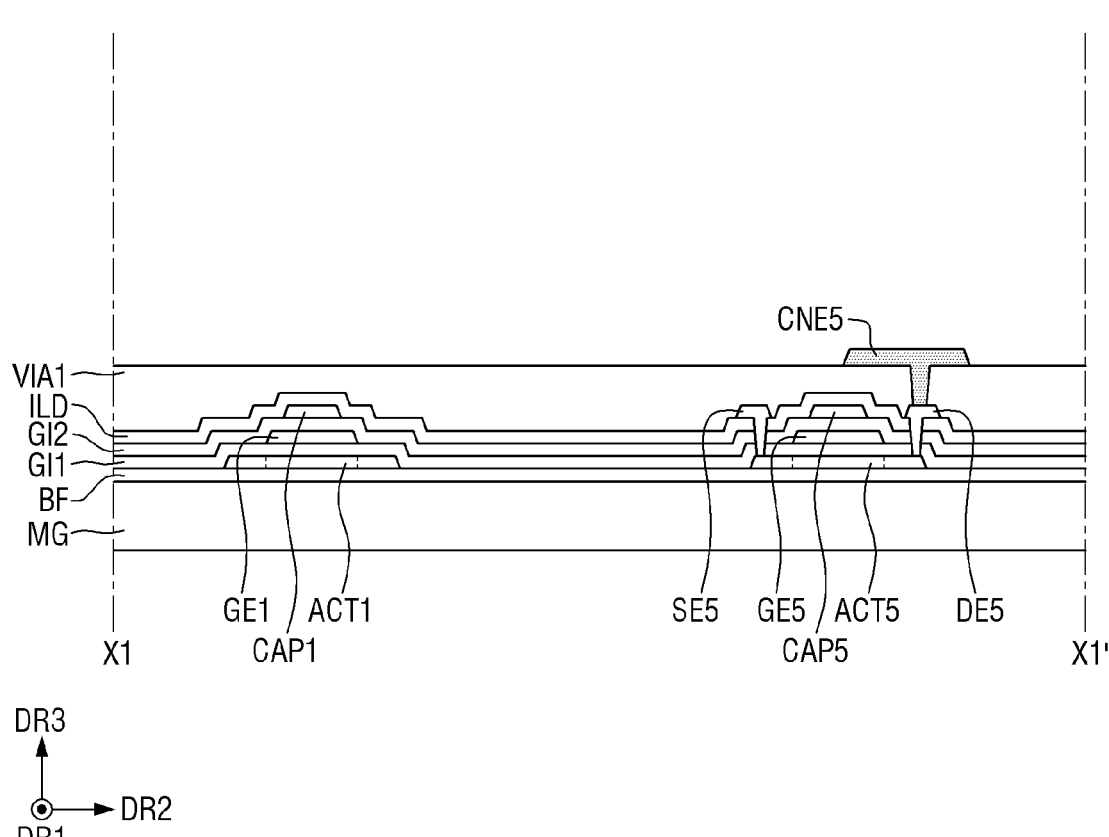
Figure 12:
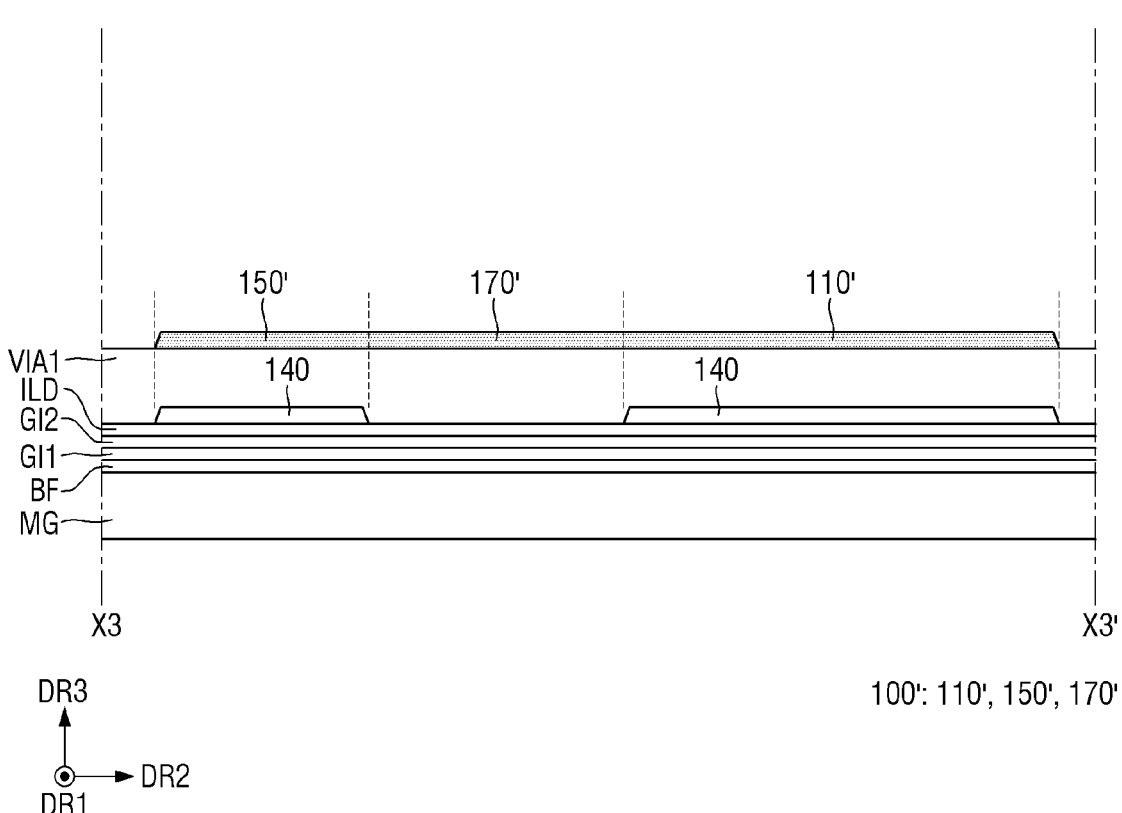

Then, referring to FIGS. 11 and 12, a fourth conductive layer CDL4 is stacked on the first via insulating layer VIA1.

In detail, a fifth connection electrode electrically connected to the fifth drain electrode by passing through the first via insulating layer VIA1 is formed on the first via insulating layer VIA1 in the display area DA of the cell C disposed in the cell area CA of the base substrate MG, and a ground material layer 100' is formed on the first via insulating layer VIA1 in the ground area GRA.

The ground material layer 100' may form the ground lines 130 and 150 and the ground pad 110 through an etching process that will be described later. In other words, the ground material layer 100' may include a ground line area 150' that becomes the ground lines 130 and 150, a ground pad area 110' that becomes the ground pad 110, and a floating area 170' etched by being disposed between the ground line area 150' and the ground pad area 110'. Since the detailed process of forming the aforementioned elements is well known in the art, its detailed description will be omitted.

Figure 13:
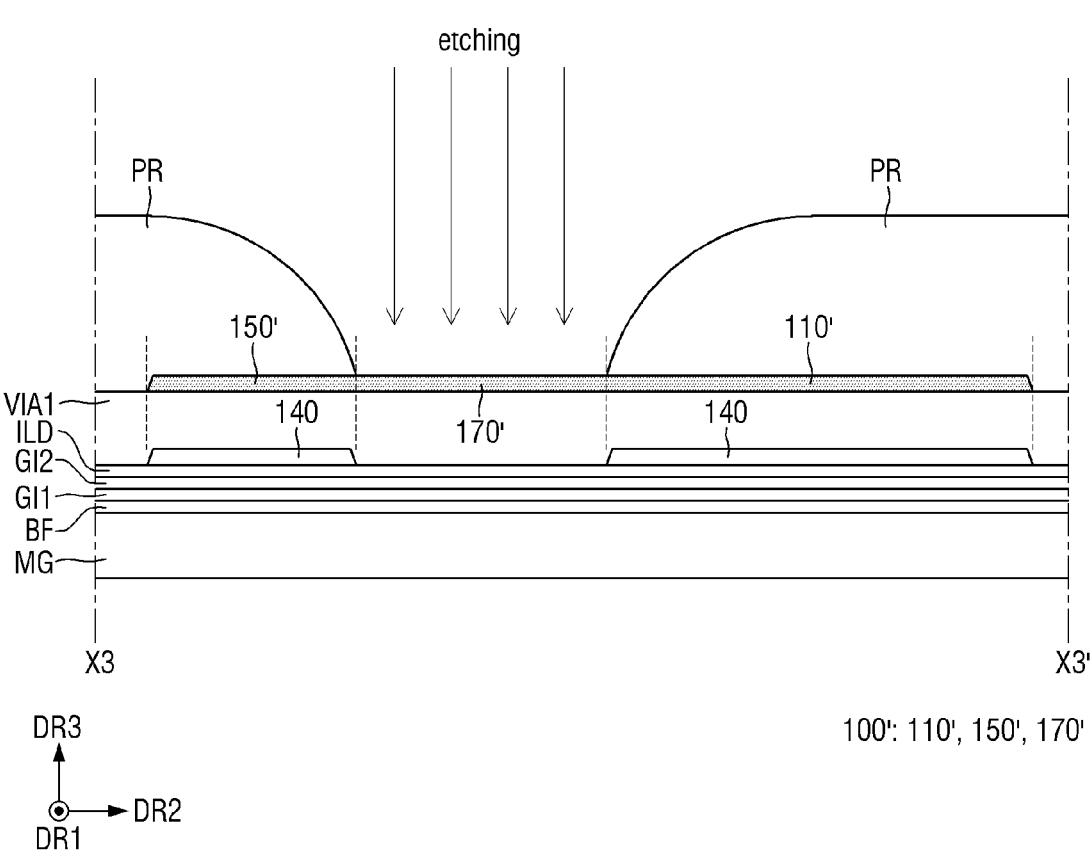
Figure 14:
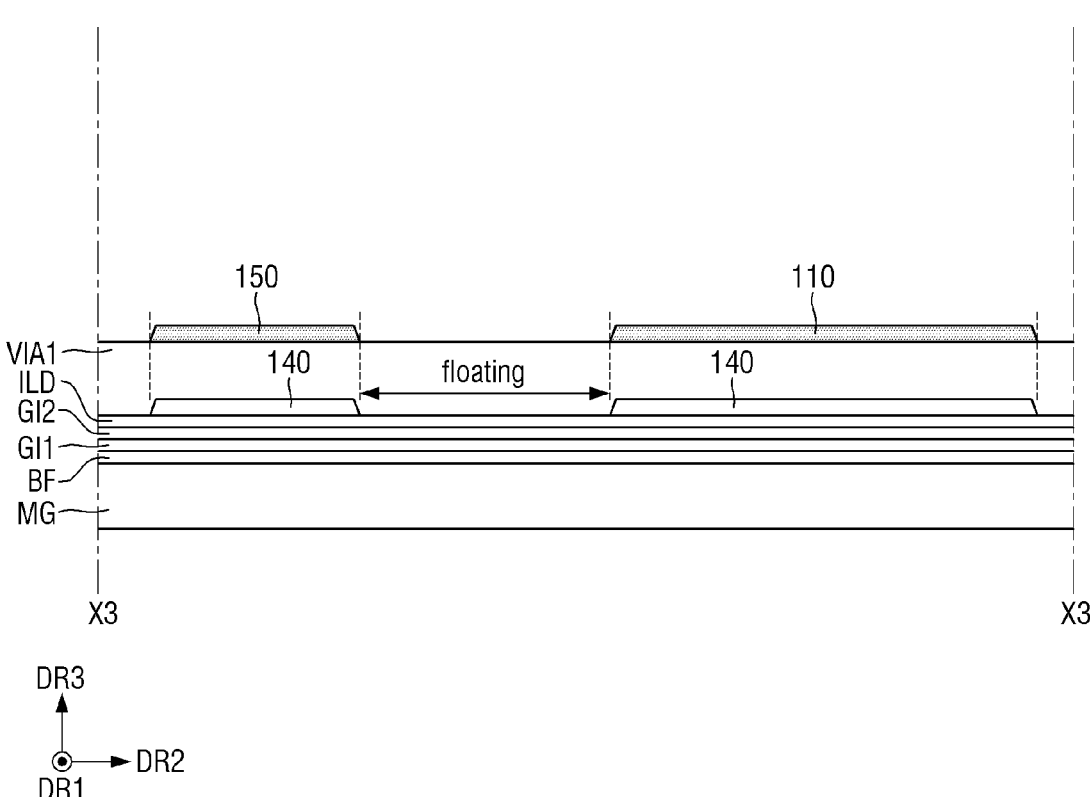
Figure 15:
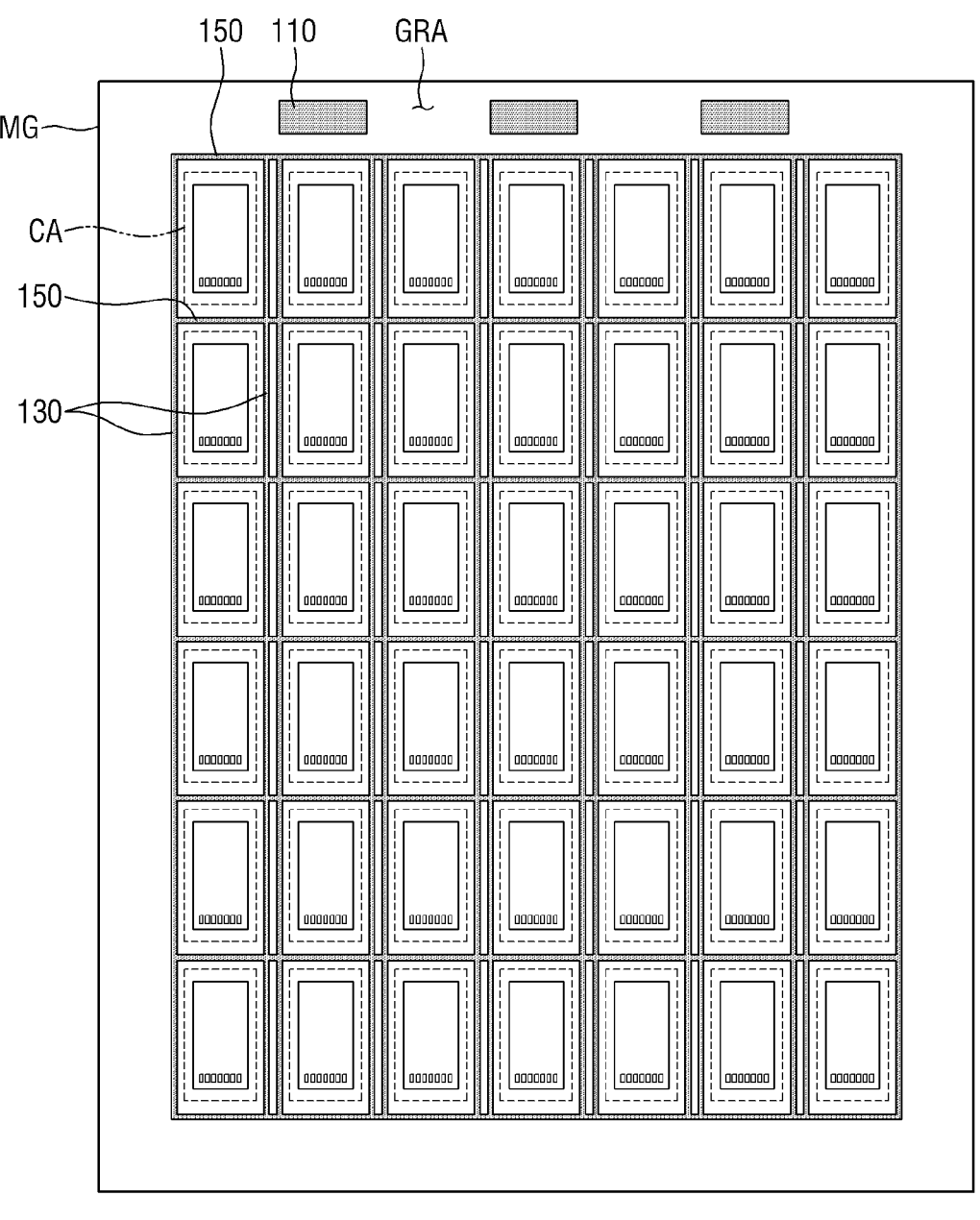

Subsequently, referring to FIGS. 13 to 15, the ground material layer 100' is etched to form the ground lines 130 and 150 and the ground pad 110. The process of etching the ground material layer 100' may be performed, for example, by dry etching, but is not limited thereto. FIGS. 13 to 15 illustrate that the ground line area 150' forms the second ground line 150.

As described above, the ground material layer 100' may include a ground line area 150', a floating area 170' and a ground pad area 110'. In the process of forming the second ground line 150 and the ground pad 110, the floating area 170' of the ground material layer 100' is etched such that the ground line area 150' and the ground pad area 110' remain, wherein the remaining ground line area 150' may be referred to as the second ground line 150, and the remaining ground pad area 110' may be referred to as the ground pad 110. In detail, when the ground material layer 100' is dry-etched, a photosensitive organic material is exposed and developed in the ground line area 150' and the ground pad area 110' to form a photoresist layer PR, and when the ground material layer 100' is dry-etched using the photoresist layer PR as an etch stop layer, the floating area 170' is only etched, and the ground line area 150' and the ground pad area 110' may remain. Afterwards, a process of removing the photoresist layer PR remaining on the ground line area 150' and the ground pad area 110' may be added.

Therefore, the second ground line 150 and the ground pad 110 may be spaced apart from each other, and may be electrically insulated from each other unless there is a separate configuration. In other words, the process of forming the ground lines 130 and 150 and the ground pad 110 may be performed, and the ground lines 140 and 150 and the ground pad 110 may be electrically insulated from each other by being spaced apart from each other with the floating area 170' interposed therebetween before the time when the ground lines 130 and 150 adjacent to the cell area CA are dry-etched. As a result of electrically insulating the ground lines 130 and 150 from the ground pad 110, an arcing phenomenon that may occur in the dry-etching process of the ground lines 130 and 150 adjacent to the cell area CA may be avoided as described below. This will be described later.

Figure 16:
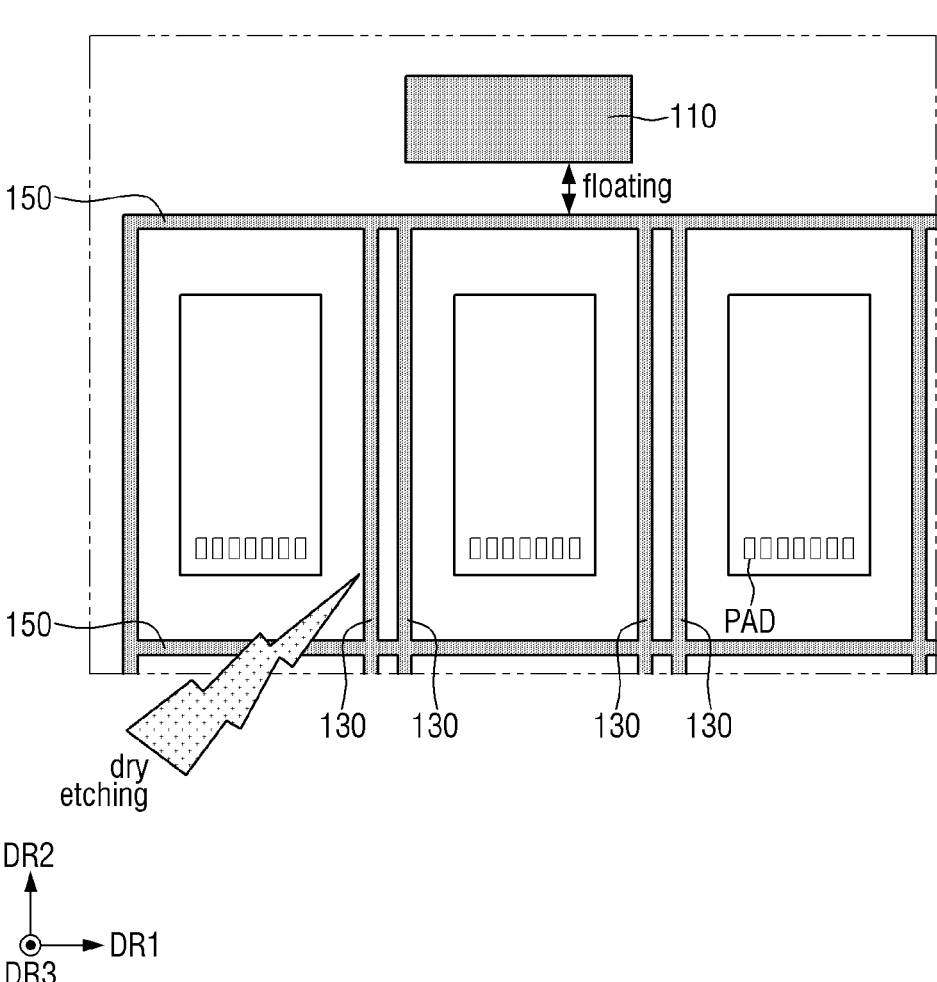

Referring to FIG. 16, the ground lines 130 and 150 adjacent to the cell area CA are dry-etched to be spaced apart from the cell area CA as much as a predetermined distance.

The ground pad 110 may be disposed at an edge of the base substrate MG, and the ground lines 130 and 150 may surround the outside of the cell area CA. Therefore, the first ground line 130 and the second ground line 150 may be disposed to be relatively adjacent to the cell C than the ground pad 110. The ground lines 130 and 150 do not remain in the display device when the display device is obtained by a cutting process that will be described later, and the ground lines 130 and 150 need to be spaced apart from the cell C as much as a predetermined distance.

As a result of the process of forming the ground lines 130 and 150, the ground lines 130 and 150 may be formed to be adjacent to the cell C in some areas. In this case, the ground lines 130 and 150 adjacent to the cell C may be etched to be spaced apart from the cell C as much as a predetermined distance. The process of etching the ground lines 130 and 150 adjacent to the cell C may be performed by a dry etching process using plasma.

When the ground line 130 and 150 and the ground pad 110 are electrically connected to each other at the time when the process of etching the ground lines 130 and 150 adjacent to the cell C is performed, thermal electrons may be generated at a portion etched by a high temperature of plasma, and the generated thermal electrons may flow toward the ground pad 110 to generate an arcing phenomenon. When the arcing phenomenon occurs, a portion of the ground lines 130 and 150 may be scattered and sprayed onto the cell C to reduce image quality of the display device that is obtained. Therefore, it is necessary to prevent the arcing phenomenon from occurring.

As described above, when the ground line 130 and 150 and the ground pad 110 are electrically insulated from each other at the time when the process of etching the ground lines 130 and 150 adjacent to the cell C is performed, the thermal electrons generated by the high temperature of the plasma cannot flow toward the ground pad 110, whereby the arcing phenomenon may be avoided.

Figure 17:
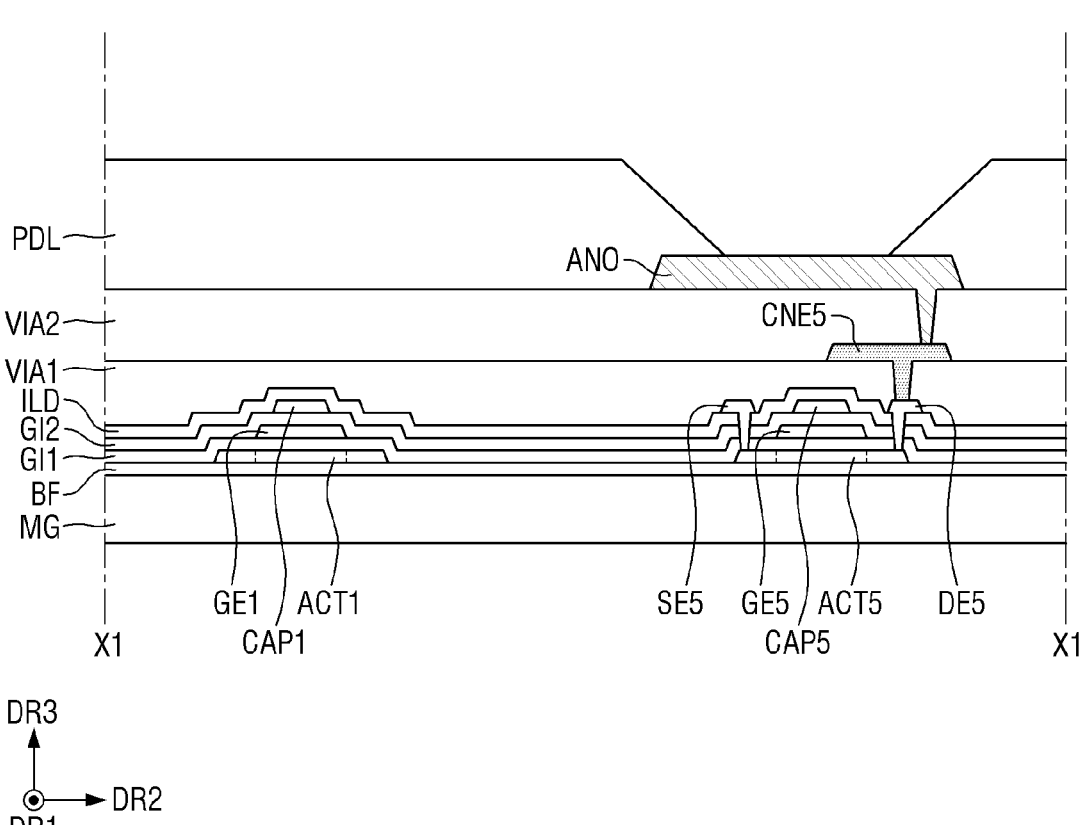
Figure 18:
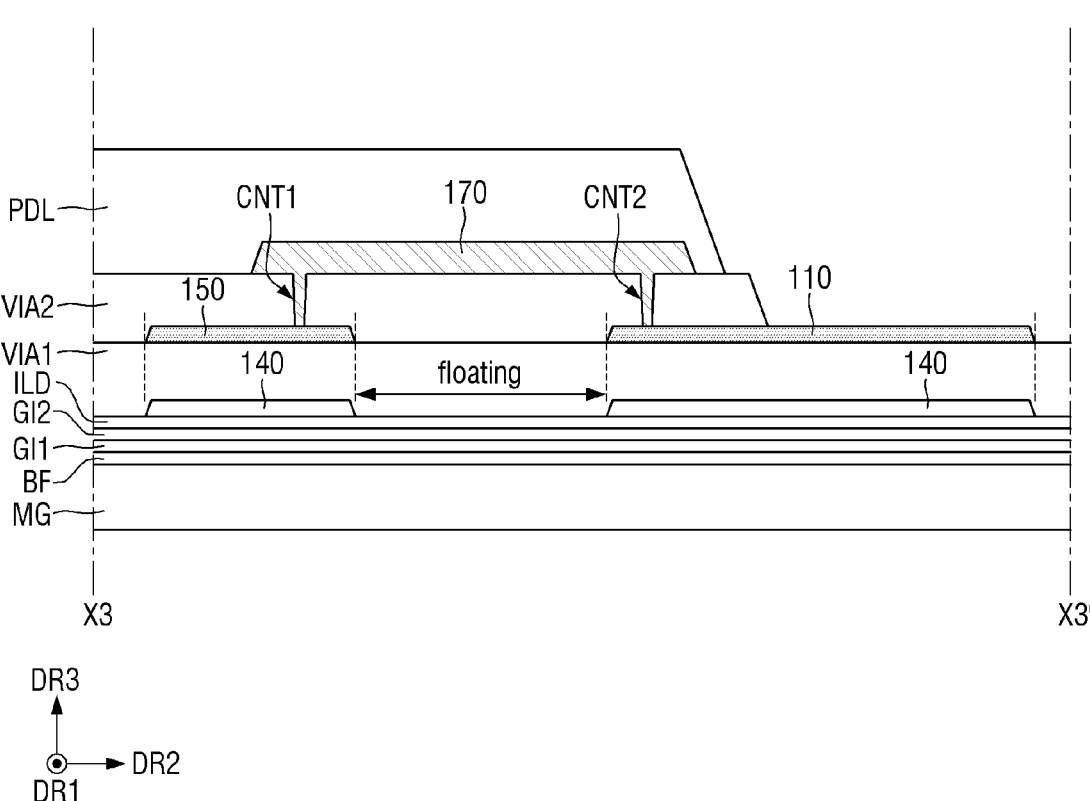
Figure 19:
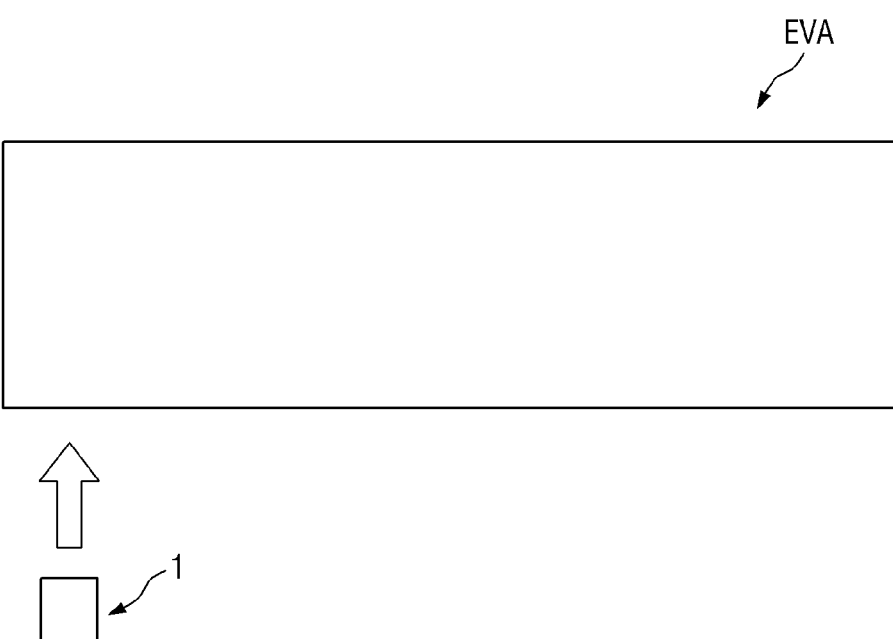

Subsequently, referring to FIGS. 17 and 18, the second via insulating layer VIA2 is formed on the fourth conductive layer CDL4, the fifth conductive layer CDL5 is formed on the second via insulating layer VIA2, and then the pixel defining layer PDL is finally formed on the fifth conductive layer CDL4.

In detail, in the display area DA of the cell C disposed in the cell area CA of the base substrate MG, the second via insulating layer VIA2 is formed on the fourth conductive layer CDL4, an anode electrode ANO electrically connected to the fifth connection electrode CNE5 by passing through the second via insulating layer VIA2 may be formed on the second via insulating layer VIA2 as the fifth conductive layer CDL5, and a pixel defining layer PDL for defining an opening area may be formed on the anode electrode ANO.

Also, in the ground area GRA of the base substrate MG, the second via insulating layer VIA2 may be formed on the fourth conductive layer CDL4, the ground connection electrode 170 electrically connected to the ground lines 130 and 150 through a first contact hole CNT1 passing through the second via insulating layer VIA2 and electrically connected to the ground pad 110 through a second contact hole CNT2 passing through the second via insulating layer VIA2 may be formed on the second via insulating layer as the fifth conductive layer CDL5, and the pixel defining layer PDL may be formed on the ground connection electrode 170.

The ground connection electrode 170 may electrically connect the ground pad 110 with the ground lines 130 and 150 at the time when the deposition process of the light emitting layer starts, as will be described later, thereby discharging static electricity that may occur during the deposition process. This will be described later.

Since the process of forming the aforementioned elements is well known in the art, its detailed description will be omitted.

Referring to FIGS. 19 to 23, the deposition process of the light emitting layer is performed by transferring a mother substrate formed to reach the pixel defining layer PDL to the deposition apparatus EVA. The deposition process of the light emitting layer may be performed, for example, by chemical vapor deposition CVD, but is not limited thereto.

Figure 21:
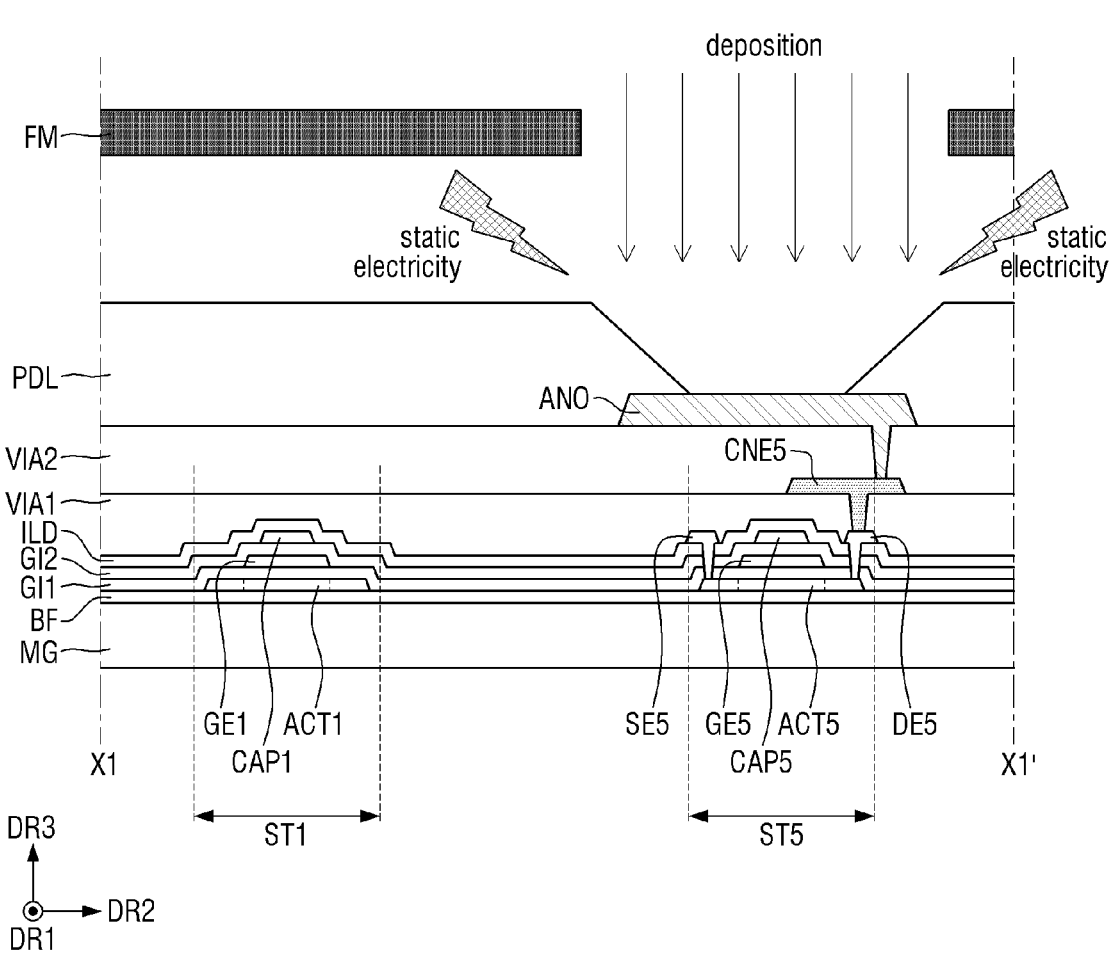

The deposition process of the light emitting layer may be performed by the deposition apparatus EVA. Therefore, the mother substrate 1 for the display device may be transferred to the deposition apparatus EVA. The deposition process of the light emitting layer may be performed using a metal mask FM within the deposition apparatus EVA as shown in FIG. 21. In the metal mask FM, since a plurality of holes corresponding to an area in which the light emitting layer EML (see FIG. 4) is deposited are formed, when the deposition process of the light emitting layer is performed, an organic material constituting the light emitting layer EML may be deposited through the plurality of holes to form the light emitting layer EML.

The deposition apparatus EVA may include a discharge electrode 300 electrically connected to the ground pad 110. The discharge electrode 300 may be embedded in the deposition apparatus EVA to discharge static electricity that will be described later. Since the deposition process of the light emitting layer is performed under high temperature and vacuum conditions, the inside of the deposition apparatus EVA into which the mother substrate 1 for the display device is inserted may be in a high temperature vacuum state. Therefore, static electricity may be generated in the deposition apparatus EVA while the deposition process of the light emitting layer is being performed. However, since the inside of the deposition apparatus EVA is in a vacuum state as described above, when a discharge path does not exist separately, there is no area to be discharged, whereby deposited organic material may be degraded or other materials may be degraded. Therefore, it is required to make sure of a path for discharging static electricity.

Figure 22:
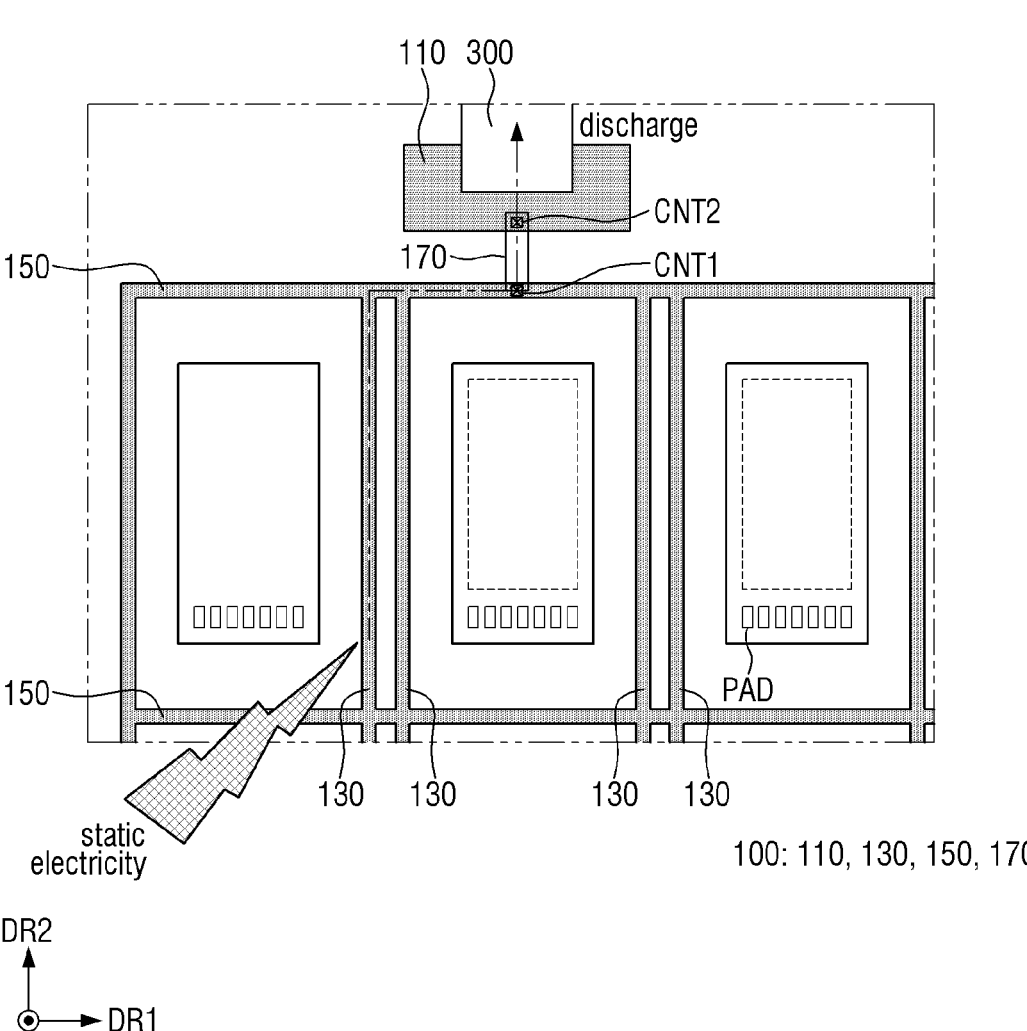
Figure 23:
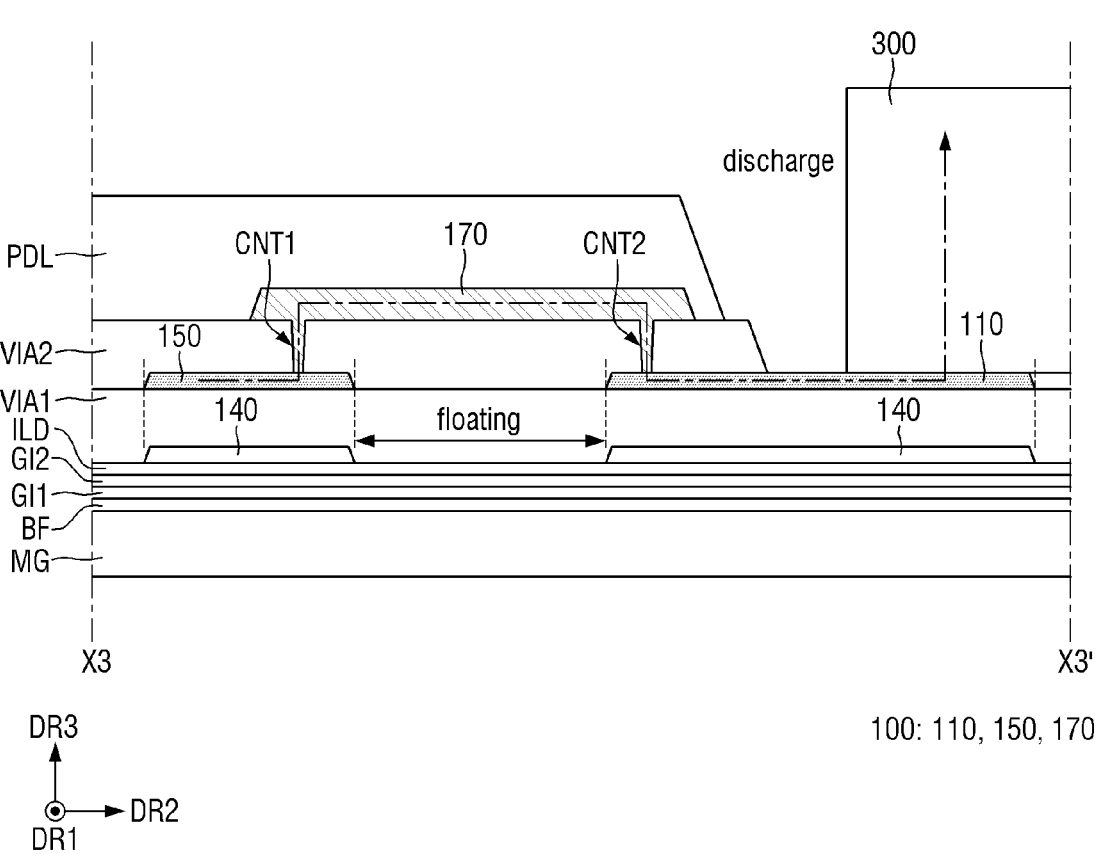

At the time when the deposition process of the light emitting layer is performed, since the ground lines 130 and 150 and the ground pad 110 are electrically connected to each other by the ground connection electrode 170, and the ground pad 110 is electrically connected to the discharge electrode 300 of the deposition apparatus EVA, a path through which static electricity is discharged may be secured. In other words, the static electricity generated during the deposition process of the light emitting layer may be discharged while being sequentially moved to the ground connection electrode 170, the ground pad 110 and the discharge electrode 300 through the ground lines 130 and 150 as shown in FIGS. 22 and 23.

Therefore, the ground portion 100 may discharge static electricity which may occur during the deposition process of the light emitting layer to prevent the light emitting layer EML or other materials from being degraded, thereby making sure of image quality of the display device to be obtained.

Figure 24:
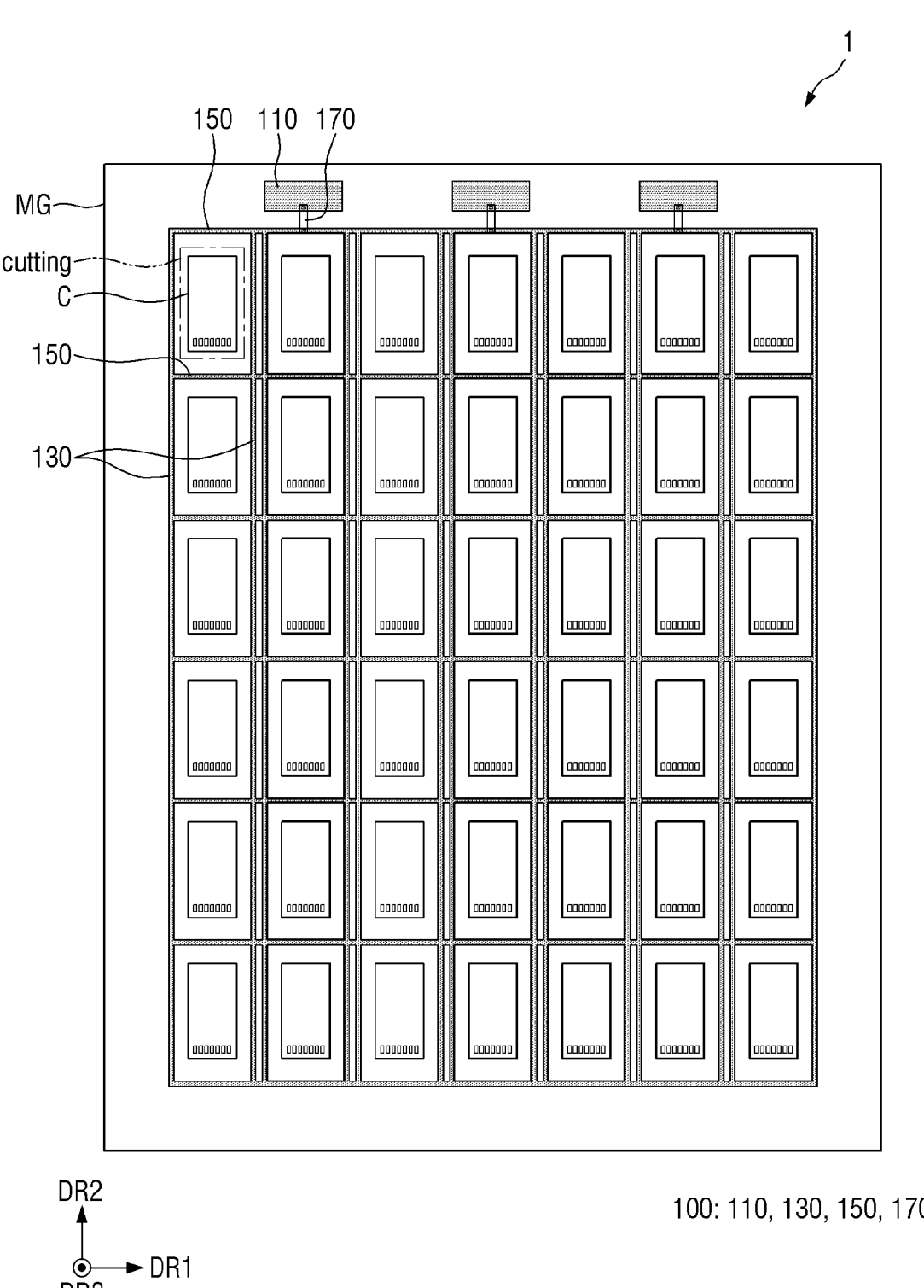

Afterwards, referring to FIG. 24, the cell area CA is cut to obtain an individual display device. The process of cutting the cell area CA may be, for example, a process using a laser, but is not limited thereto.

Hereinafter, another example of a mother substrate 1 for a display device according to one embodiment of the disclosure will be described. In the following embodiment, the same reference numerals will be given to the same elements as those of the previously described embodiment, a redundant description of the previously described embodiment will be omitted or simplified, and the description will be based on a difference from the previously described embodiment.

Figure 25:
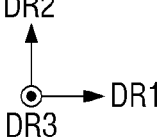
FIG. 25 is a schematic plan view illustrating a mother substrate for a display device according to another embodiment.
Figure 26:
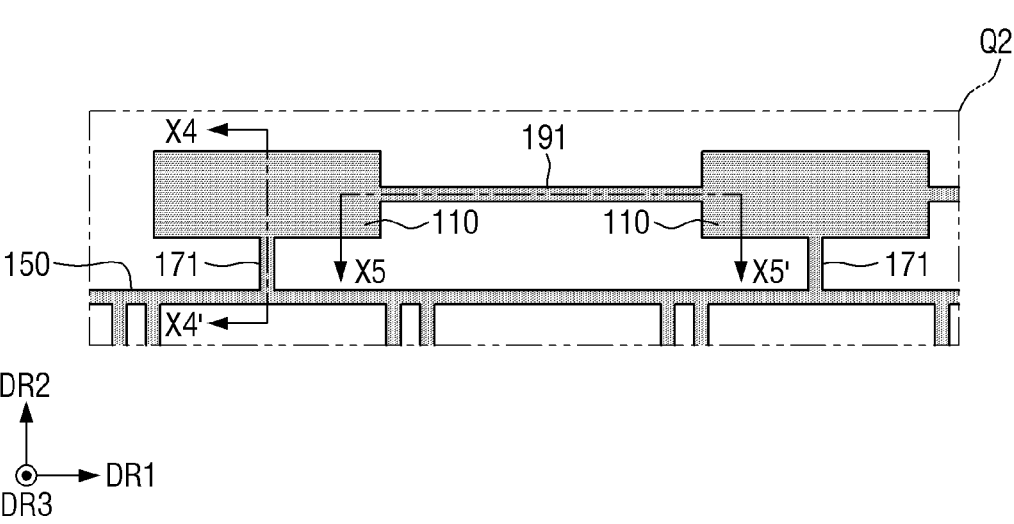
FIG. 26 is an enlarged view illustrating an area Q2 of FIG. 25.
Figure 27:
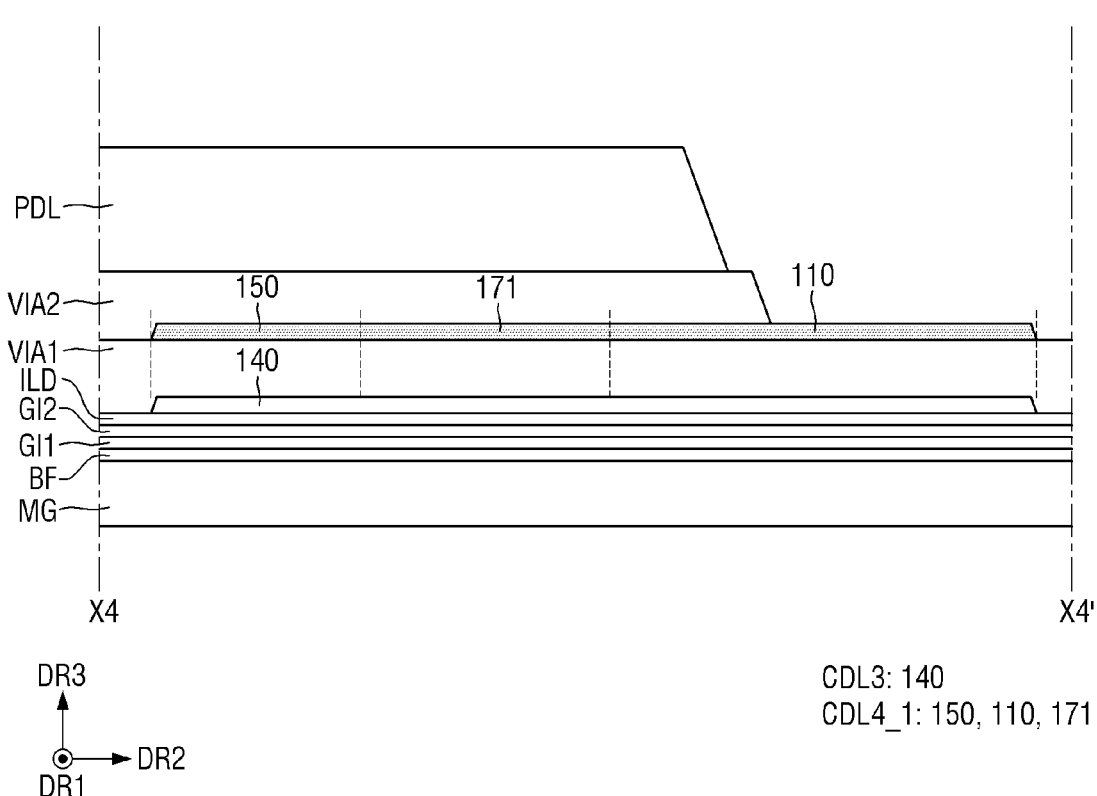
FIG. 27 is a schematic cross-sectional view taken along line X4-X4' of FIG. 26, specifically a cross-sectional view illustrating a connection relation of a ground line, a ground pad and a ground connection electrode according to the embodiment of FIG. 25.

FIG. 25 is a schematic plan view illustrating a mother substrate for a display device according to another embodiment of the disclosure. FIG. 26 is an enlarged view illustrating an area Q2 of FIG. 25. FIG. 27 is a schematic cross-sectional view taken along line X4-X4' of FIG. 26, specifically a cross-sectional view illustrating a connection relation of a ground line, a ground pad and a ground connection electrode according to the embodiment of FIG.

Figure 28:
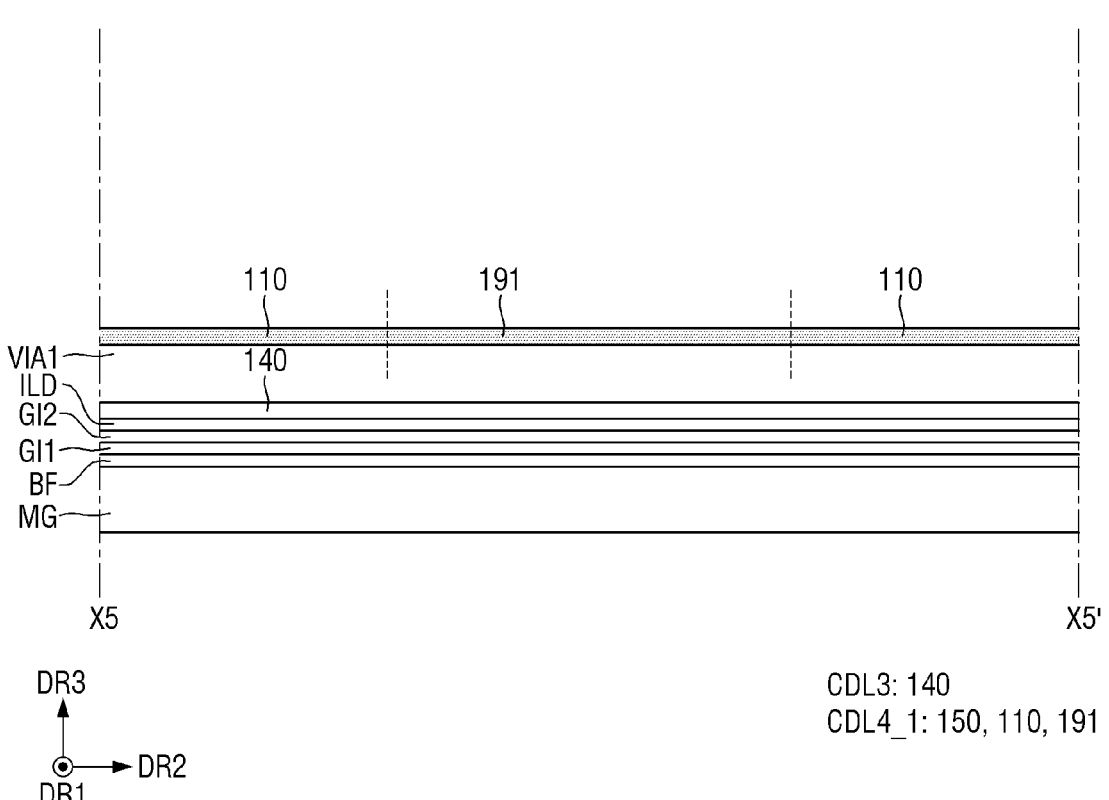
FIG. 28 is a schematic cross-sectional view taken along line X4-X4' of FIG. 26, specifically a cross-sectional view illustrating a connection relation between ground pads according to the embodiment of FIG. 25.
Figure 29:
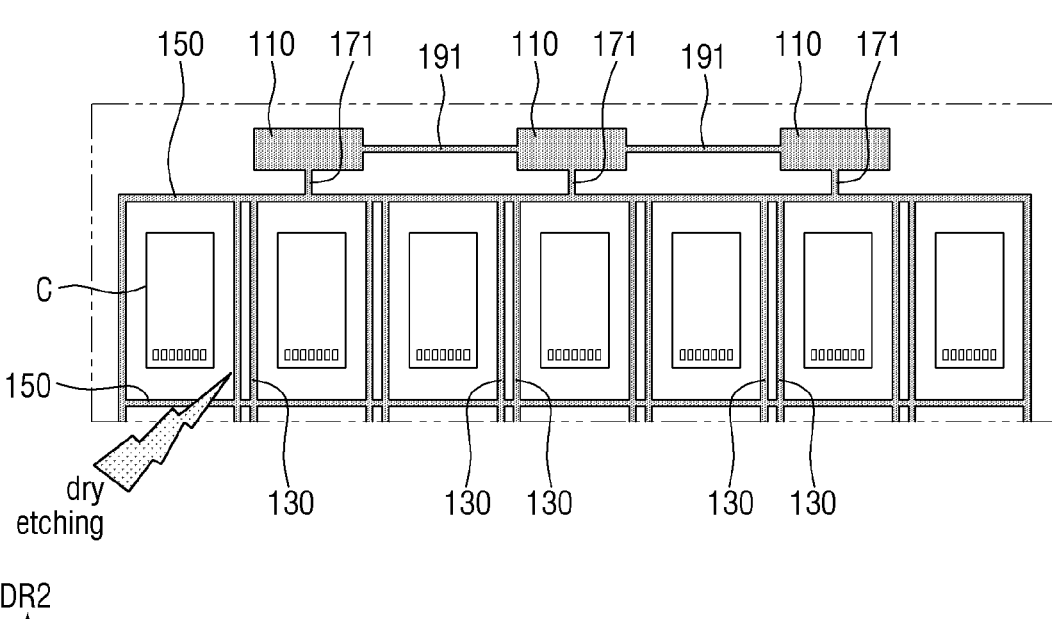
FIG. 29 is a schematic view illustrating that arcing is prevented from occurring in a dry etching process of a ground portion according to the embodiment of FIG. 25.

25. FIG. 28 is a schematic cross-sectional view taken along line X4-X4' of FIG. 26, specifically a cross-sectional view illustrating a connection relation between ground pads according to the embodiment of FIG. 25. FIG. 29 is a schematic view illustrating that arcing is prevented from occurring in a dry etching process of a ground portion according to the embodiment of FIG. 25.

Referring to FIGS. 25 to 29, in a mother substrate 1_1 for a display device according to the present embodiment, ground lines 130 and 150 and a plurality of ground pads 110 of the ground portion 101 are electrically connected to each other. In detail, the mother substrate 1_1 for a display device according to the present embodiment is different from the mother substrate 1 for a display device according to one embodiment in that the ground lines 130 and 150 and the ground pad 110 are integrally formed, a ground pad connection electrode 191 is disposed between the respective ground pads 110, and each of the ground pads 110 and the ground pad connection electrode 191 disposed between the respective ground pads 110 are integrally formed such that the ground lines 130 and 150 may be electrically connected to the plurality of ground pads 110. The other elements of the mother substrate 1_1 are substantially the same as or similar to those of the mother substrate 1.

As shown in FIGS. 27 and 28, a fourth conductive layer CDL4_1 disposed on the mother substrate 1_1 for the display device according to the present embodiment may include ground lines 130 and 150, a ground pad 110, a ground connection electrode 171, and a ground pad connection electrode 191.

The ground connection electrode 171 may be integrally formed with the ground pad 110 and the ground lines 130 and 150 to electrically connect the ground pad 110 with the ground lines 130 and 150. The ground connection electrode 171 according to the present embodiment may be formed through the same process as that of the ground pad 110 and the ground lines 130 and 150. In other words, the ground connection electrode 171, the ground pad 110 and the ground lines 130 and 150 may correspond to the fourth conductive layer CDL4_1, and may include the same material.

The ground pad connection electrode 191 may be disposed between the plurality of ground pads 110 spaced apart from each other and integrally formed with the plurality of ground pads 110 to electrically connect the respective ground pads 110 with each other. The ground pad connection electrode 191 may connect a side of the ground pad 110 in the first direction DR1. In detail, the ground connection electrode 171 may electrically connect the side of the ground pad 110 in the second direction DR2 to the ground lines 130 and 150, and the ground pad connection electrode 191 may electrically connect the side of the ground pad 110 in the first direction DR1 to the ground pad 110 adjacent thereto.

The ground pad connection electrode 191 may be formed through the same process as that of the ground pad 110, the ground lines 130 and 150 and the ground connection electrode 171. In other words, the ground lines 130 and 150, the ground pad 110, the ground connection electrode 171 and the ground pad connection electrode 191 may correspond to the fourth conductive layer CDL4_1, and may include the same material.

In some embodiments, a width of the ground pad connection electrode 191 may be less than that of the ground pad 110, but is not limited thereto. In some embodiments, the second via insulating layer VIA2 and the pixel defining layer PDL may not be disposed on the ground pad connection electrode 191, but are not limited thereto.

As shown in FIG. 29, at the time when a process of etching the ground lines 130 and 150 adjacent to the cell C is performed, the fourth conductive layer CDL4_1 is formed on the mother substrate 1_1 for the display device similarly to the description of FIG. 16, and since the ground lines 130 and 150 and each of the plurality of ground pads 110 are connected to each other by the ground pad connection electrodes 191, a path through which the thermal electrons formed by the high temperature of the plasma move is increased so that the thermal electrons are not concentrated on one side, whereby arcing may be avoided.

Also, similarly to the description in FIGS. 19 to 23, the static electricity that may occur during the process may be sequentially moved to the ground connection electrode 171, the ground pad 110 and the discharge electrode 300 through the ground lines 130 and 150 and then discharged Although embodiments of the present inventive concepts have been described, various modifications and similar arrangements of such embodiments will be apparent to a person of ordinary skill in the art. Accordingly, the inventive concepts are not limited to such embodiments, but rather to the scope and spirit of the appended claims.

What is claimed is:

1. A mother substrate, comprising:
   a base substrate including a plurality of cell areas and a ground area surrounding each cell area of the plurality of cell areas;
   a ground line disposed to surround an edge of each cell area of the plurality of cell areas and wherein the ground line is disposed between at least two cell areas of the plurality of cell areas;
   a ground pad disposed to be spaced apart from the ground line on the ground area; and
   a ground connection electrode disposed on a surface of the ground line and a surface of the ground pad, the ground connection electrode electrically connecting the ground line with the ground pad,
   wherein each cell area of the plurality of cell areas includes a thin film transistor and a light emitting element disposed on the thin film transistor and electrically connected to each other by a connection electrode disposed between the light emitting element and the thin film transistor;
   a first via insulating layer disposed between the thin film transistor and the connection electrode in the cell area and extended to the ground area,
   wherein the connection electrode is disposed directly on one surface of the first via insulating layer in the cell area, and
   the ground line and the ground pad are disposed directly on one surface of the first via insulating layer in the ground area.

2. The mother substrate of claim 1, wherein the light emitting element and the thin film transistor are electrically insulated from the ground line, the ground pad and the ground connection electrode.

3. The mother substrate of claim 2,
   wherein the ground line and the ground pad comprise the same material as that of the connection electrode.

4. The mother substrate of claim 3, wherein the light emitting element comprises an anode electrode disposed on the connection electrode and electrically connected to the connection electrode, and
   the anode electrode and the ground connection electrode comprise the same material.

5. The mother substrate of claim 4, wherein the ground line and the ground pad are spaced apart from each other on the first via insulating layer to form a floating.

6. The mother substrate of claim 5, further comprising a second via insulating layer disposed between the connection electrode and the anode electrode in the cell area and extended to the ground area, wherein the anode electrode is disposed directly on one surface of the second via insulating layer in the cell area, and the ground connection electrode is disposed directly on one surface of the second via insulating layer in the ground area.

7. The mother substrate of claim 6, wherein the ground connection electrode is electrically connected to the ground line through a first contact hole, which passes through the second via insulating layer, in the ground area, and is electrically connected to the ground pad through a second contact hole that is spaced apart from the first contact hole and passes through the second via insulating layer.

8. The mother substrate of claim 6, wherein the second via insulating layer exposes a portion of the ground pad.

* * * * *